(12) United States Patent
Soutome et al.

(10) Patent No.: US 7,884,609 B2
(45) Date of Patent: Feb. 8, 2011

(54) HIGH FREQUENCY COIL AND MAGNETIC RESONANCE IMAGING APPARATUS

(75) Inventors: Yoshihisa Soutome, Tokyo (JP); Hideta Habara, Musashino (JP); Yoshitaka Bito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/071,899

(22) Filed: Feb. 27, 2008

(65) Prior Publication Data

US 2009/0021256 A1  Jan. 22, 2009

(30) Foreign Application Priority Data

Jul. 19, 2007  (JP)  ............................. 2007-187844

(51) Int. Cl.
*G01V 3/00* (2006.01)

(52) U.S. Cl. ..................... 324/322; 324/318; 324/321

(58) Field of Classification Search ......... 324/300–322; 600/407–435
See application file for complete search history.

(56) References Cited

U.S. PATENT DOCUMENTS

| | | | | |
|---|---|---|---|---|
| 4,782,296 | A * | 11/1988 | Schmalbein et al. | 324/316 |
| 5,677,629 | A * | 10/1997 | Borsboom | 324/318 |
| 5,682,098 | A * | 10/1997 | Vij | 324/318 |
| 5,696,449 | A * | 12/1997 | Boskamp | 324/318 |
| 5,757,189 | A * | 5/1998 | Molyneaux et al. | 324/318 |
| 6,404,199 | B1 * | 6/2002 | Fujita et al. | 324/318 |
| 6,590,392 | B2 * | 7/2003 | Boskamp et al. | 324/318 |
| 6,624,633 | B1 * | 9/2003 | Zou et al. | 324/318 |
| 6,727,700 | B2 * | 4/2004 | Marek | 324/318 |
| 7,084,629 | B2 * | 8/2006 | Monski et al. | 324/318 |
| 7,391,213 | B2 * | 6/2008 | Watkins et al. | 324/318 |
| 7,446,528 | B2 * | 11/2008 | Doddrell et al. | 324/318 |

(Continued)

FOREIGN PATENT DOCUMENTS

JP  03-131235  7/1990

OTHER PUBLICATIONS

C.-N. Chen et al., "Quadrature Detection Coils—A Further (square root of 2) Improvement in Sensitivity", Journal of Magnetic Resonance, vol. 54 (1983), pp. 324-327.
G. H. Glover et al., "Comparison of Linear and Circular Polarization for Magnetic Resonance Imaging", Journal of Magnetic Resonance, vol. 64 (1985), pp. 255-270.
Zahi A. Fayad et al., "An Improved Quadrature or Phased-Array Coil for MR Cardiac Imaging", (1995), pp. 186-193.
K. Vij et al., "A Quadrature Neck Coil Array", p. 1108.

(Continued)

*Primary Examiner*—Melissa J Koval
*Assistant Examiner*—Tiffany A Fetzner
(74) *Attorney, Agent, or Firm*—Stites & Harbison, PLLC; Juan Carlos A. Marquez, Esq.

(57) ABSTRACT

To provide an RF coil of an MRI apparatus and improve the irradiation efficiency and the reception sensitivity of a circular polarized magnetic field with a simple structure.

An RF coil has a set of input/output terminals and two loops. The two loops are disposed and capacitors in the loops are adjusted so that the linearly polarized magnetic fields generated and detected by the loops are perpendicular to each other, and the combined magnetic field of the linearly polarized magnetic fields is a circular polarized magnetic field.

8 Claims, 27 Drawing Sheets

U.S. PATENT DOCUMENTS

| | | | |
|---|---|---|---|
| 7,609,064 B2 * | 10/2009 | Fukuda et al. | 324/322 |
| 7,619,412 B2 * | 11/2009 | Okamoto et al. | 324/318 |
| 2002/0149367 A1 * | 10/2002 | Boskamp et al. | 324/318 |
| 2002/0190715 A1 * | 12/2002 | Marek | 324/318 |
| 2004/0075437 A1 * | 4/2004 | Srinivasan | 324/318 |
| 2004/0220468 A1 * | 11/2004 | Watkins et al. | 600/410 |
| 2004/0220469 A1 * | 11/2004 | Jevtic et al. | 600/422 |
| 2004/0236209 A1 * | 11/2004 | Misic et al. | 600/423 |
| 2005/0099179 A1 * | 5/2005 | Monski et al. | 324/318 |
| 2006/0244453 A1 * | 11/2006 | Doty | 324/322 |
| 2006/0267588 A1 * | 11/2006 | Okamoto et al. | 324/318 |
| 2007/0114998 A1 * | 5/2007 | Yoshida | 324/318 |
| 2008/0312523 A1 * | 12/2008 | Dunseath | 600/383 |
| 2009/0021256 A1 * | 1/2009 | Soutome et al. | 324/318 |

OTHER PUBLICATIONS

Steven M. Wright, "Circular Polarization from Receiver Coils with a Single Coupling Loop: A Simple Technique for Quadrature Detection", p. 137.

P.B. Roemer et al., "The NMR Phased Array", Magnetic Resonance in Medicine, vol. 16, 1990, pp. 192-195.

* cited by examiner

Fig. 1
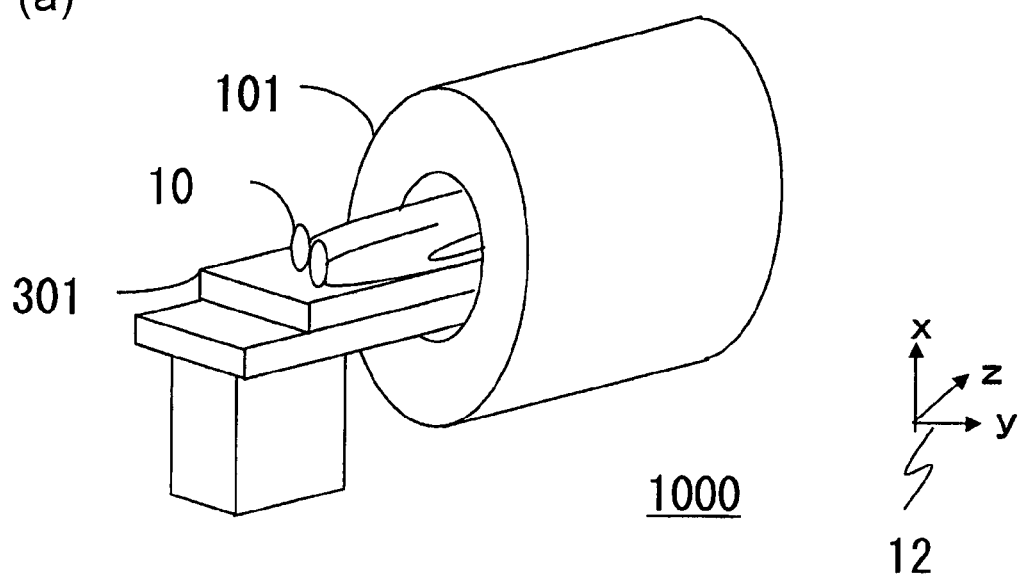
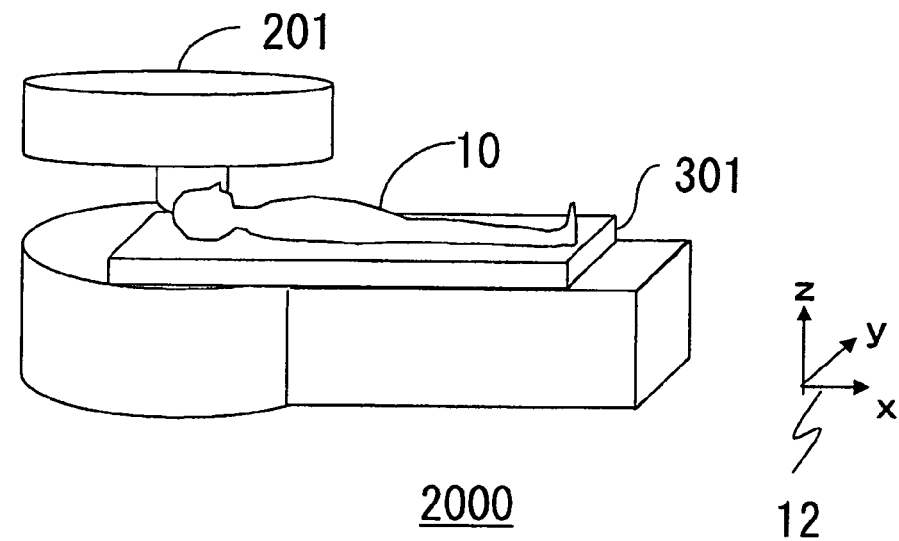

Fig. 3
(a)
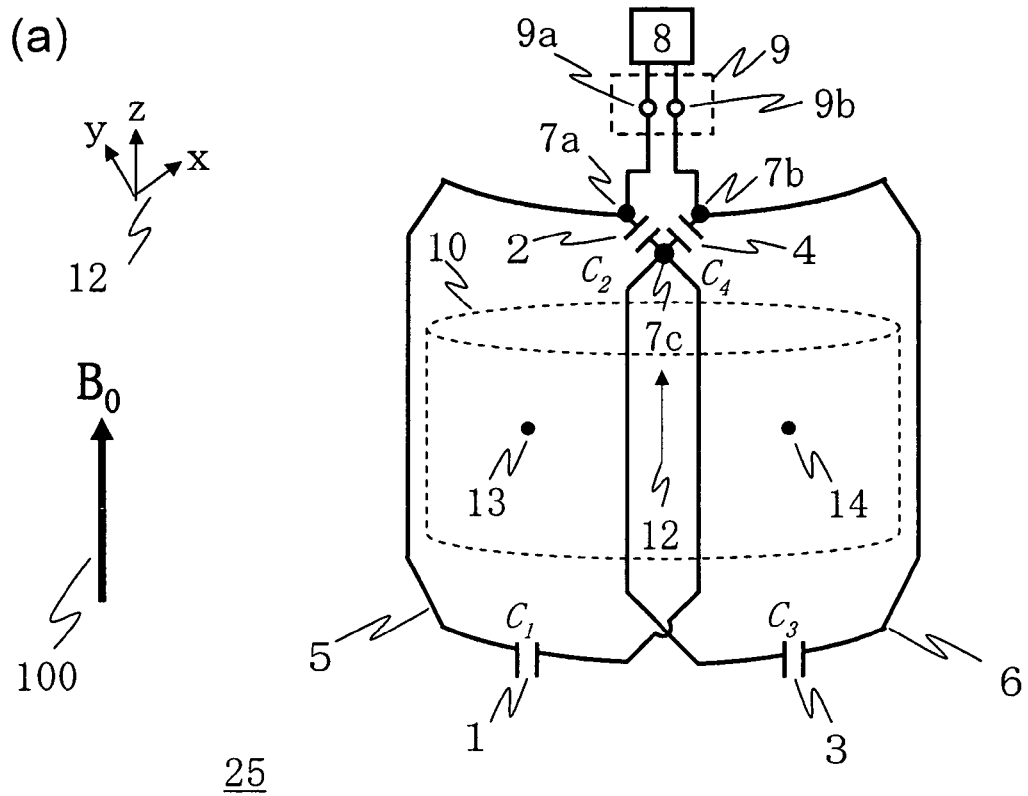
(b)
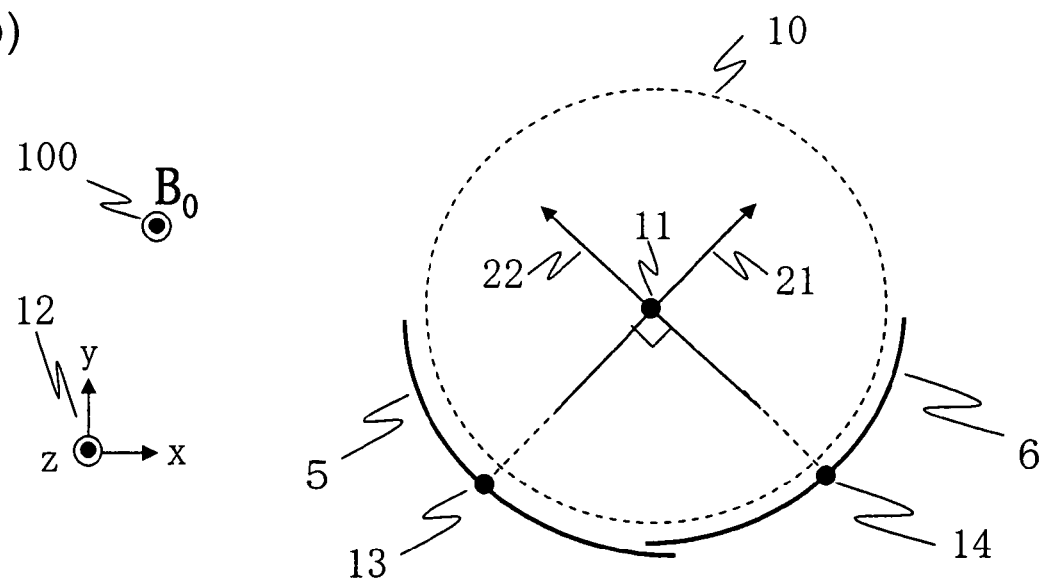

Fig. 5
(a)
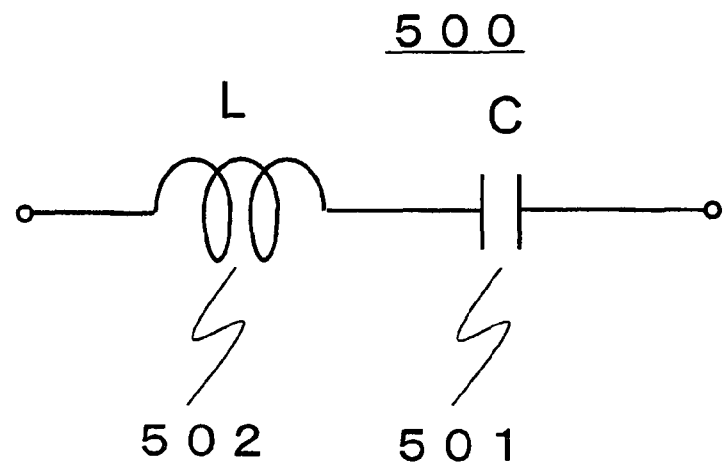
(b)
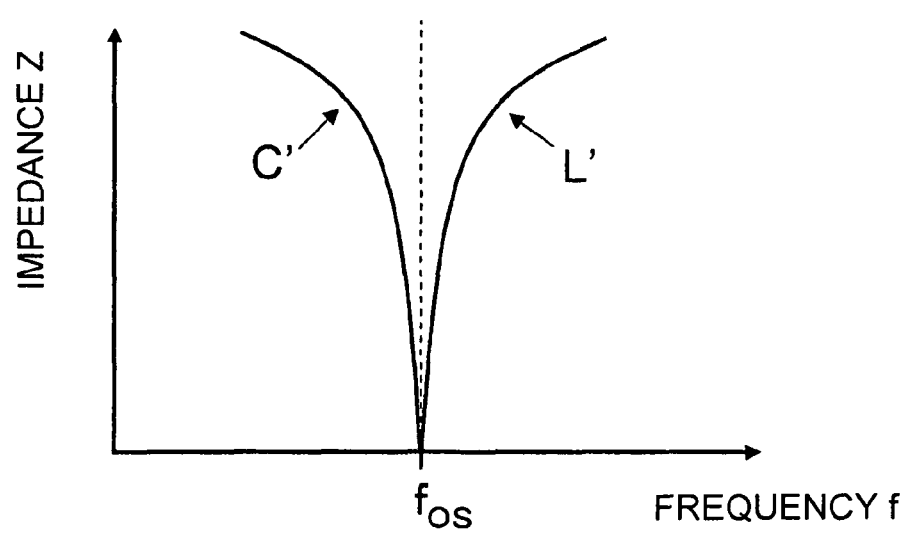

Fig. 7
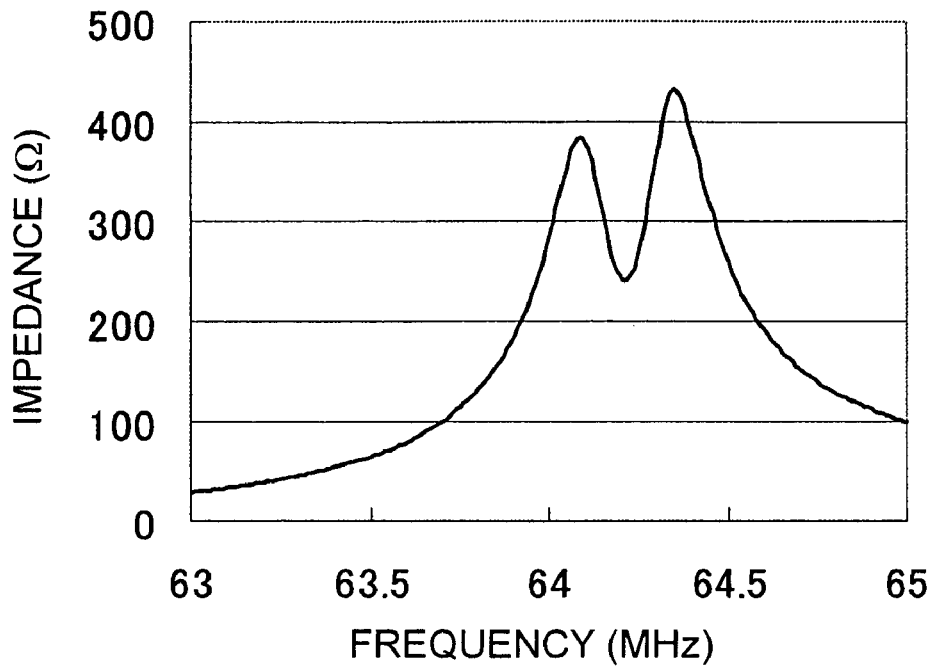
(a)
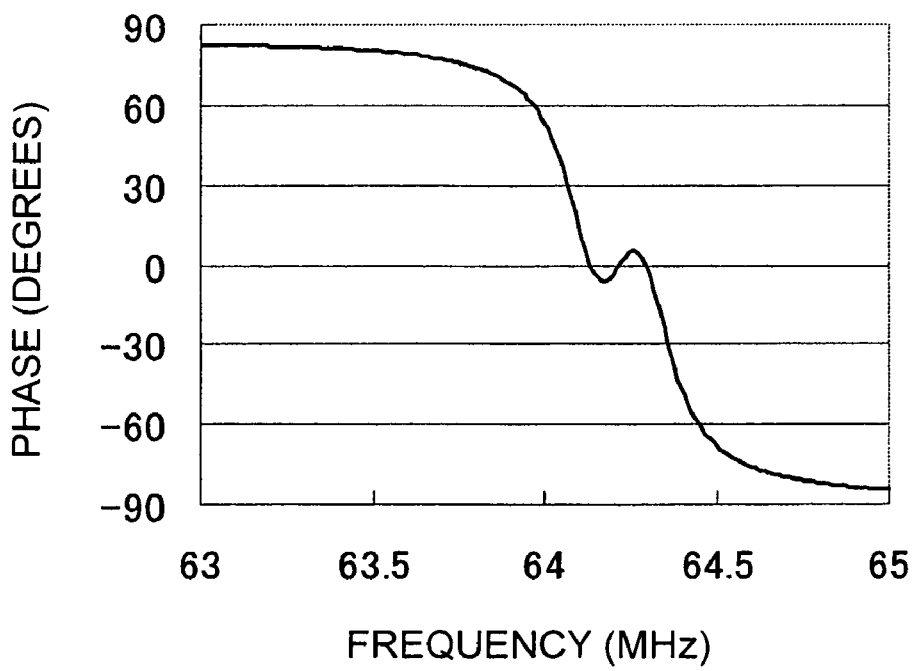
(b)

Fig. 8
(a)
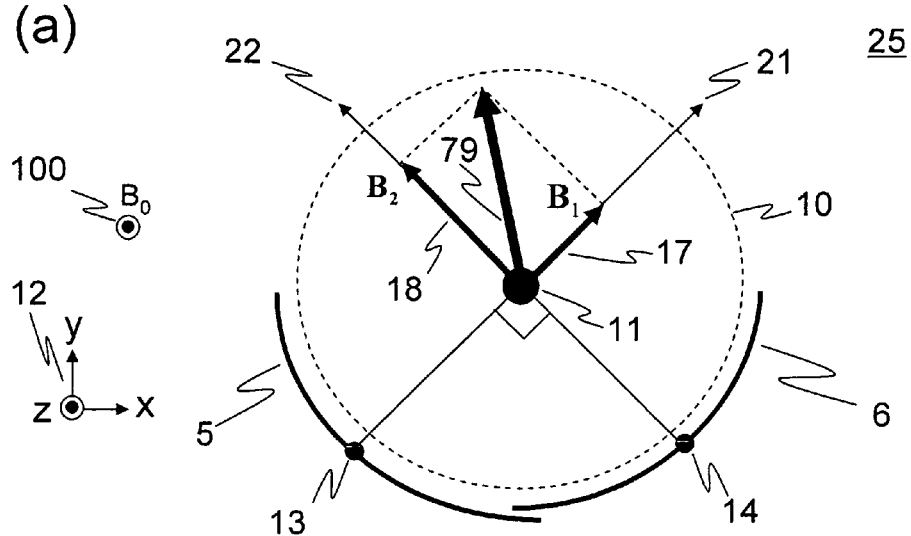
(b)
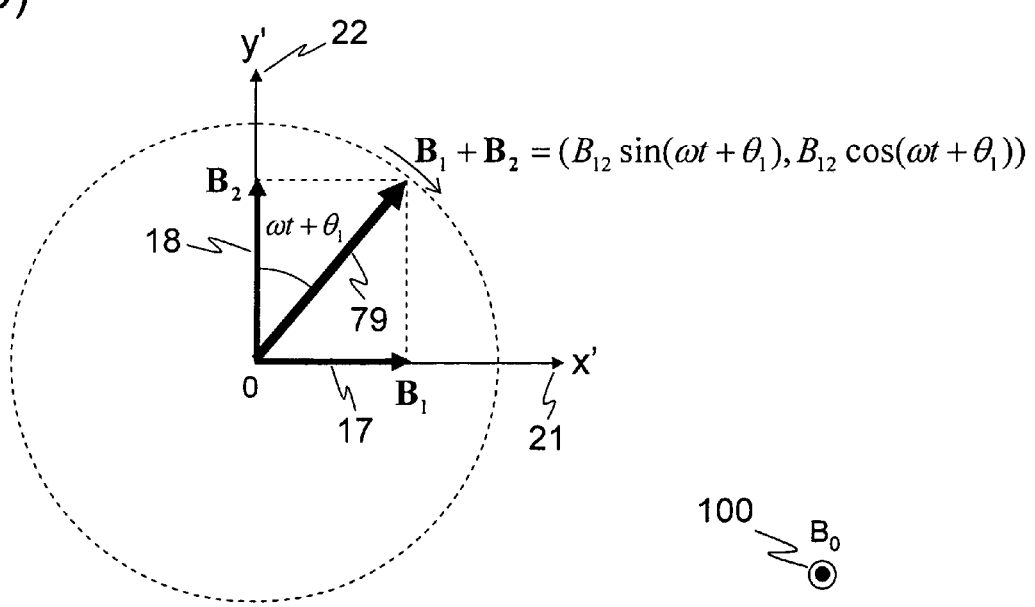

Fig. 9
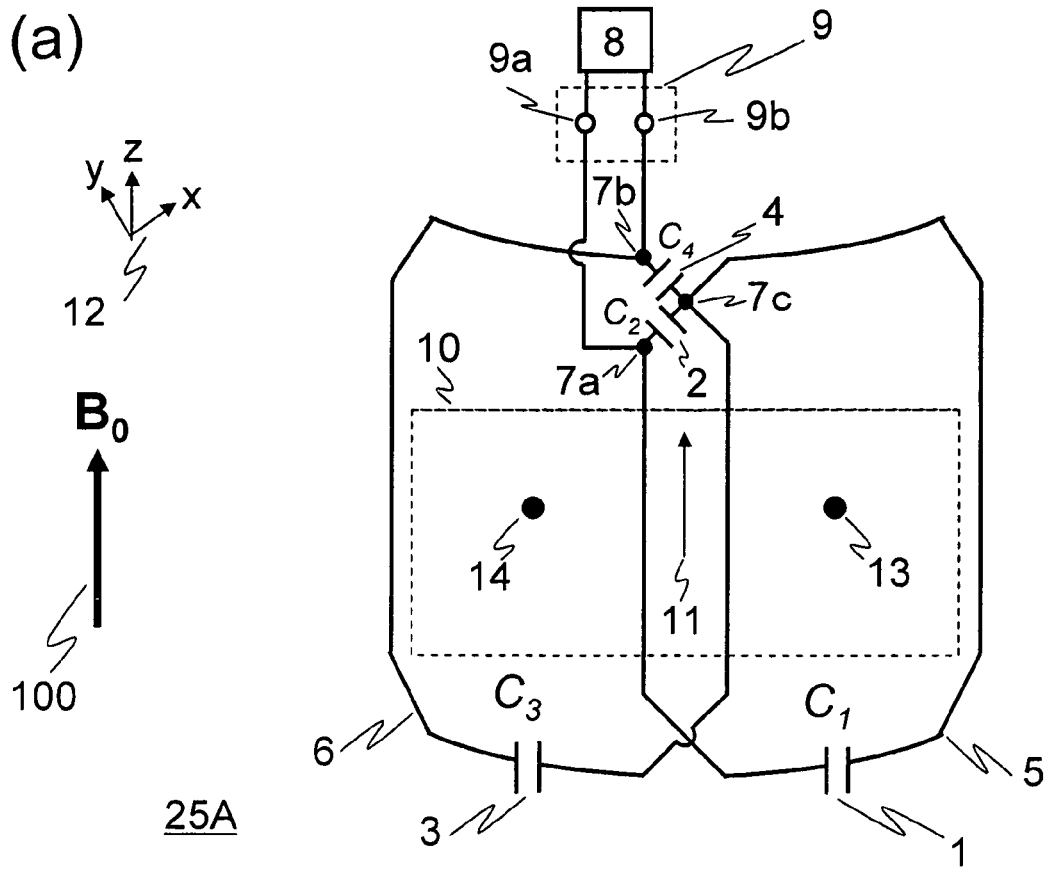
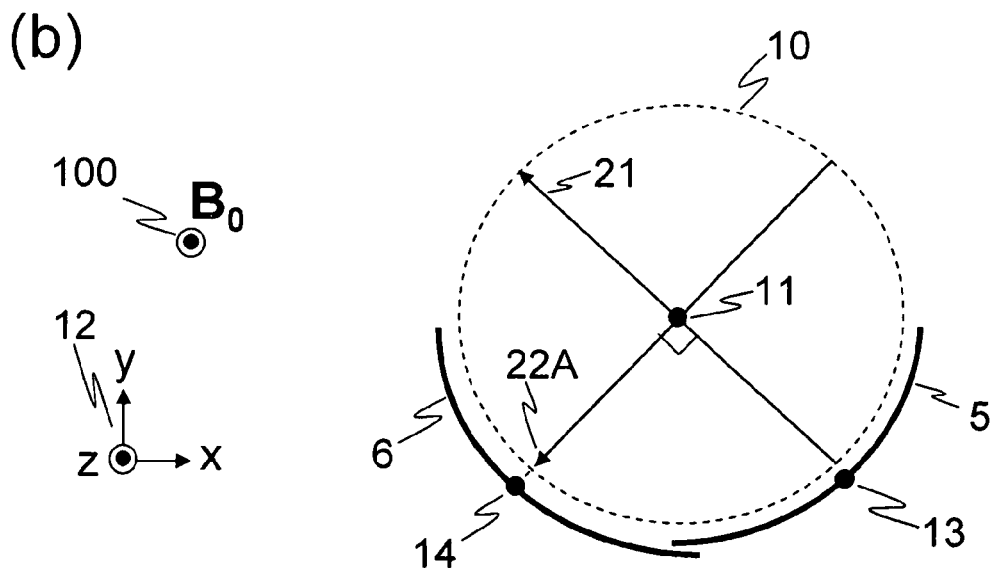

Fig. 10
(a)
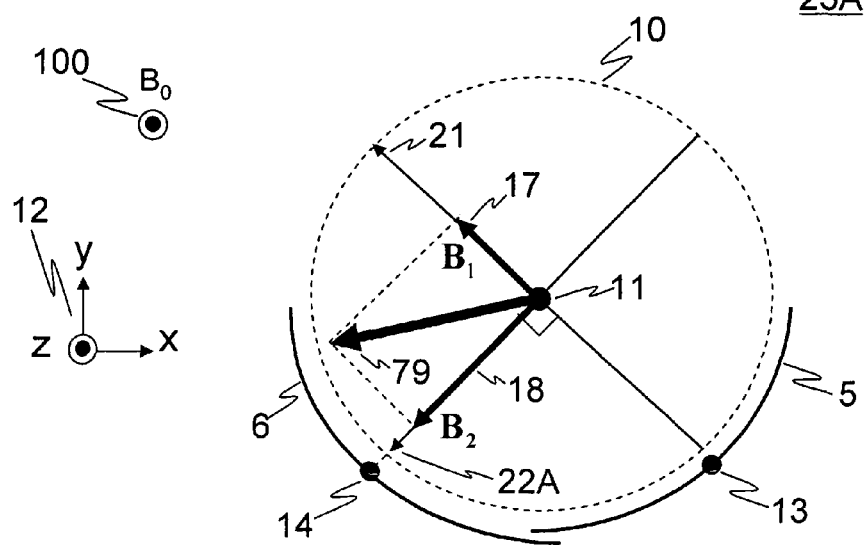
(b)
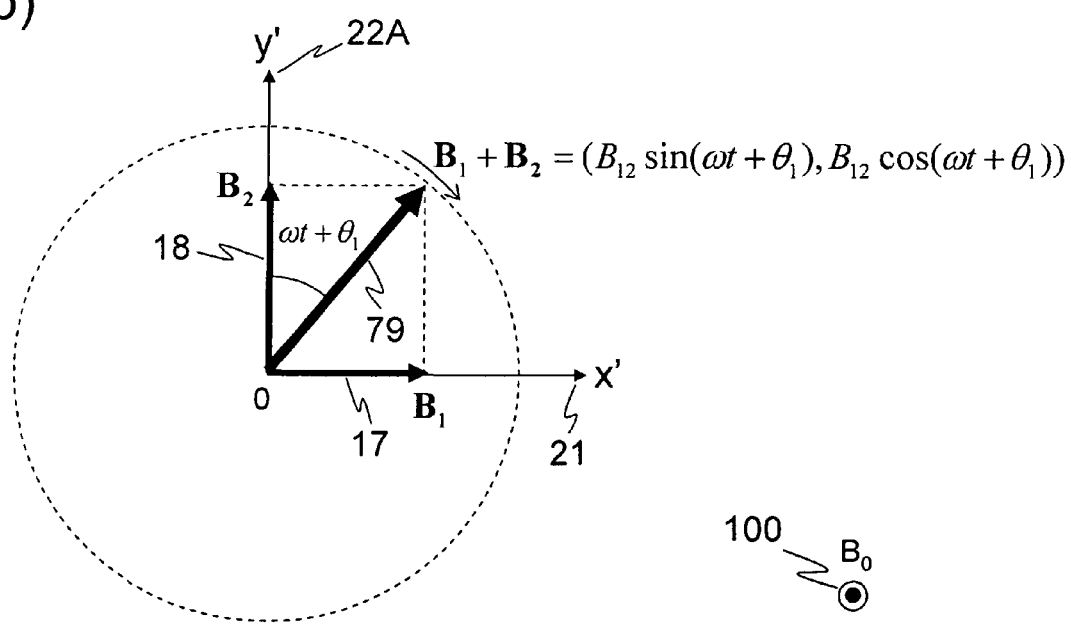

Fig. 11
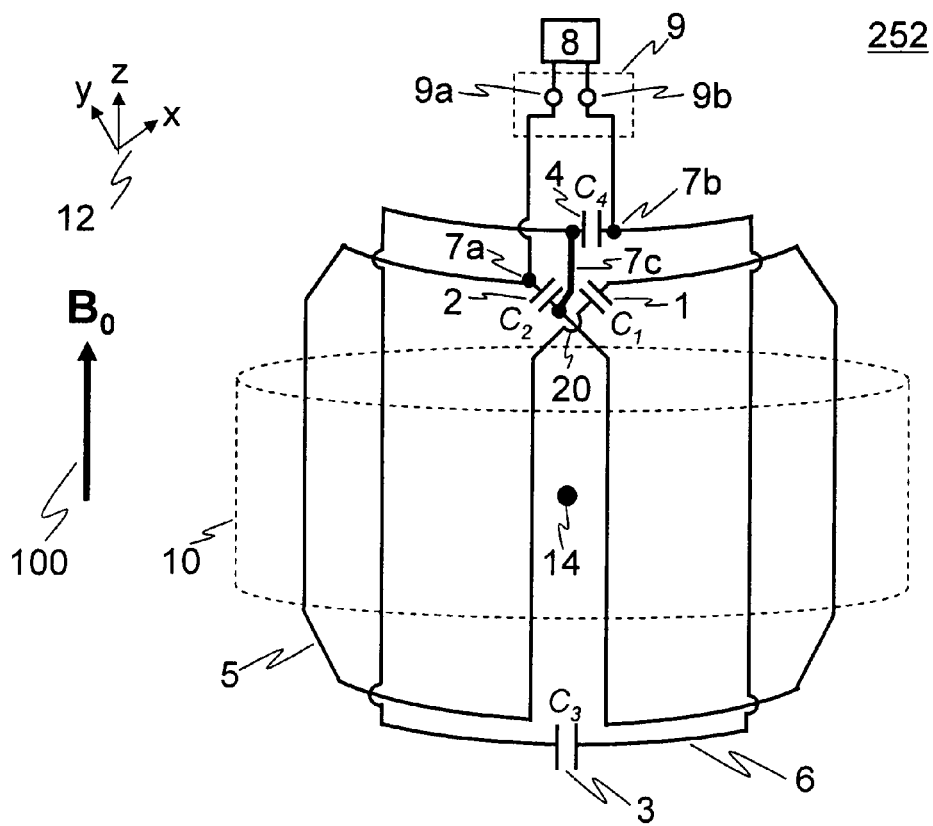
(a)
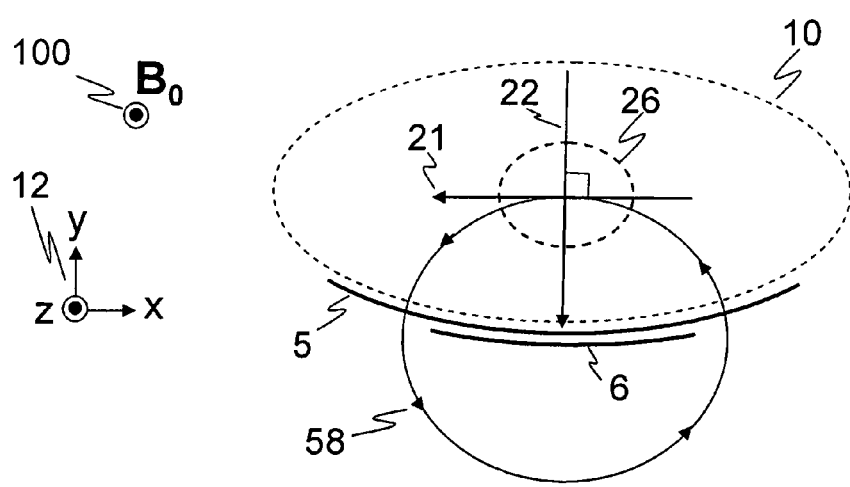
(b)

Fig. 13
(a)
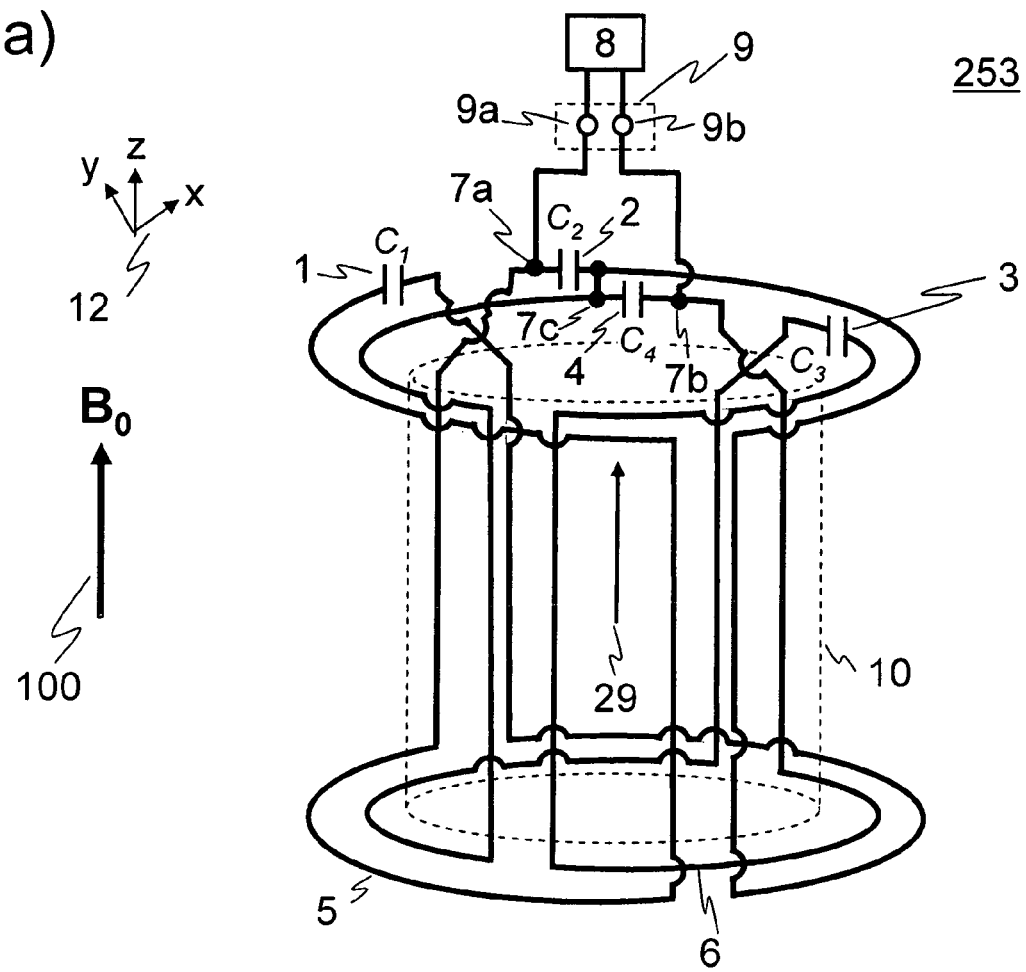
(b)
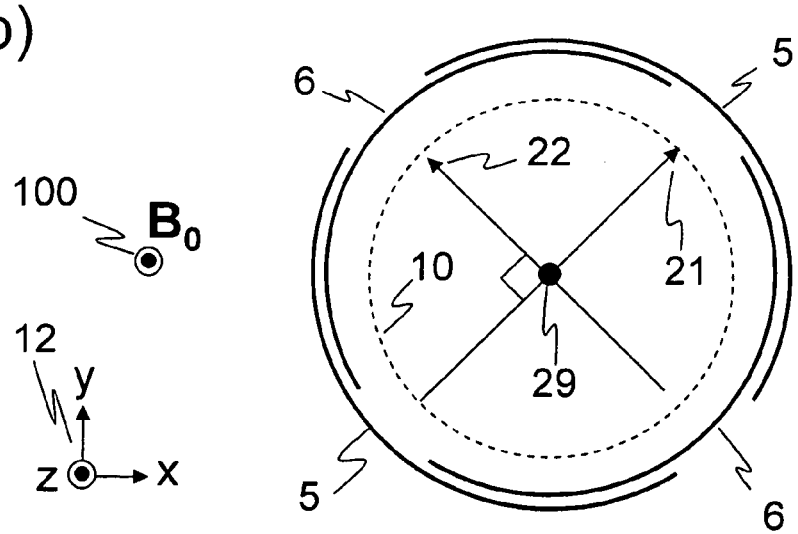

Fig. 14
(a)
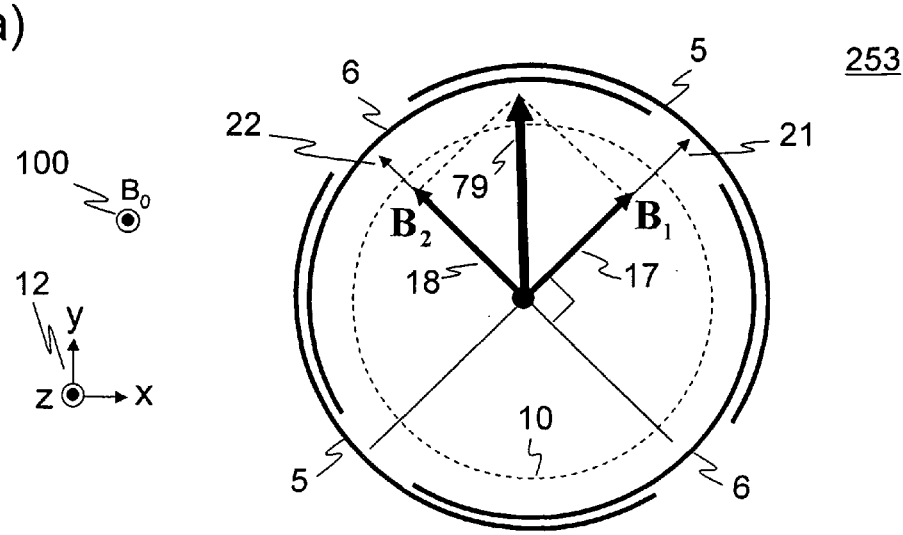
(b)
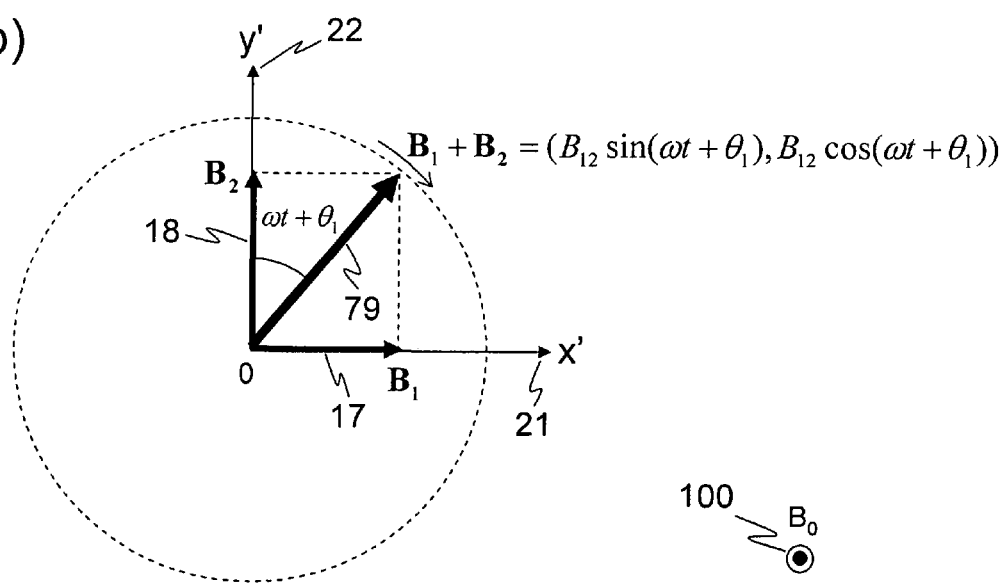

Fig. 16
(a)
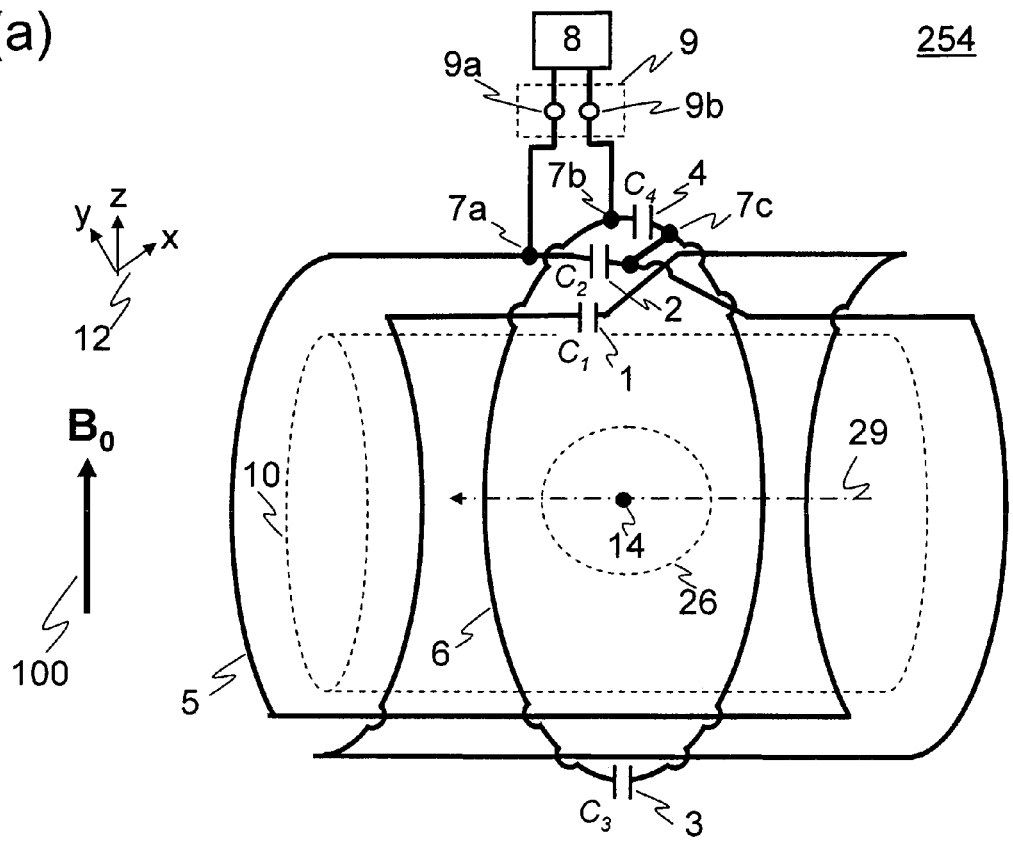
(b)
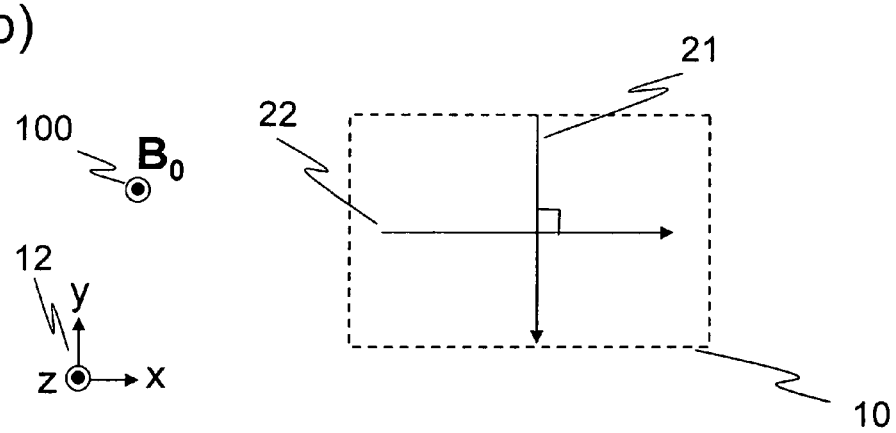

Fig. 17
(a)
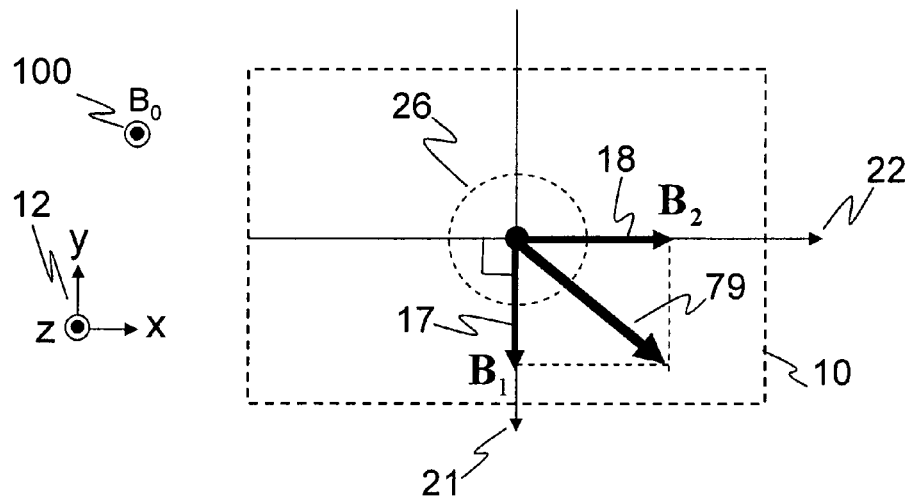
(b)
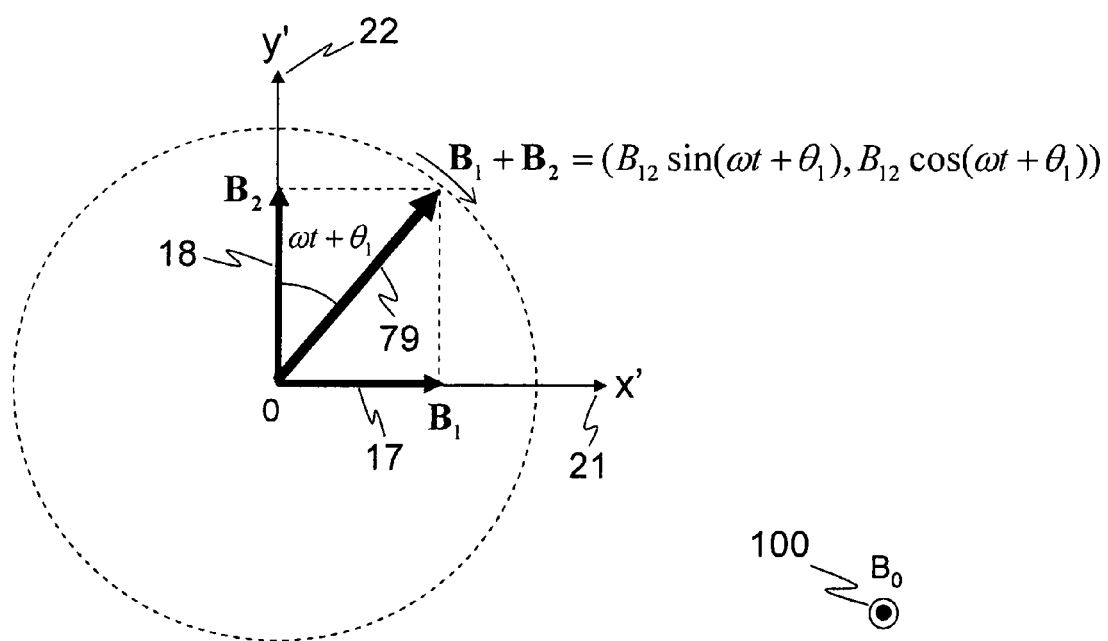

Fig. 19
(a)
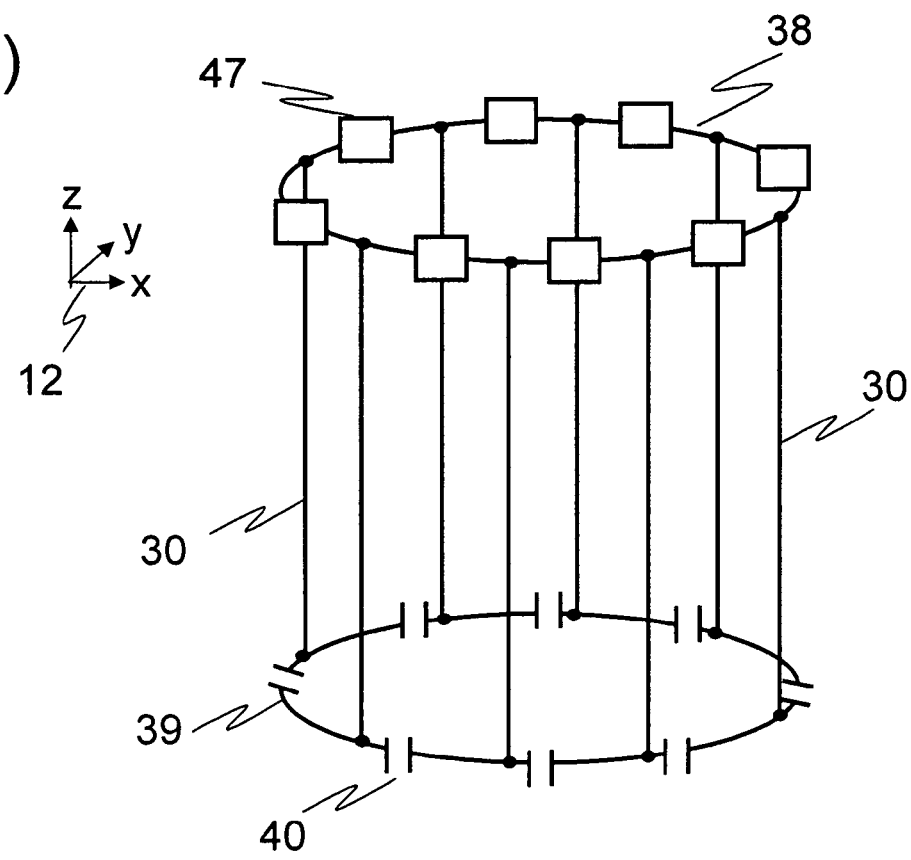
(b)
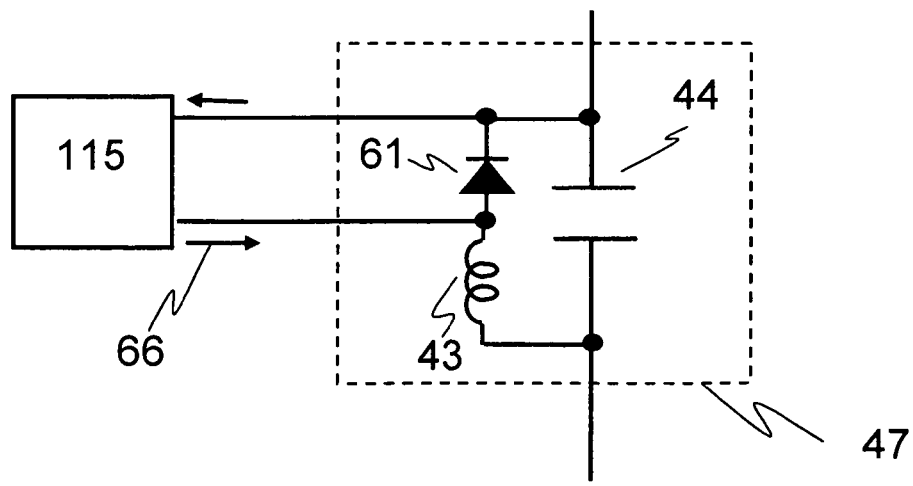

Fig. 20
(a)
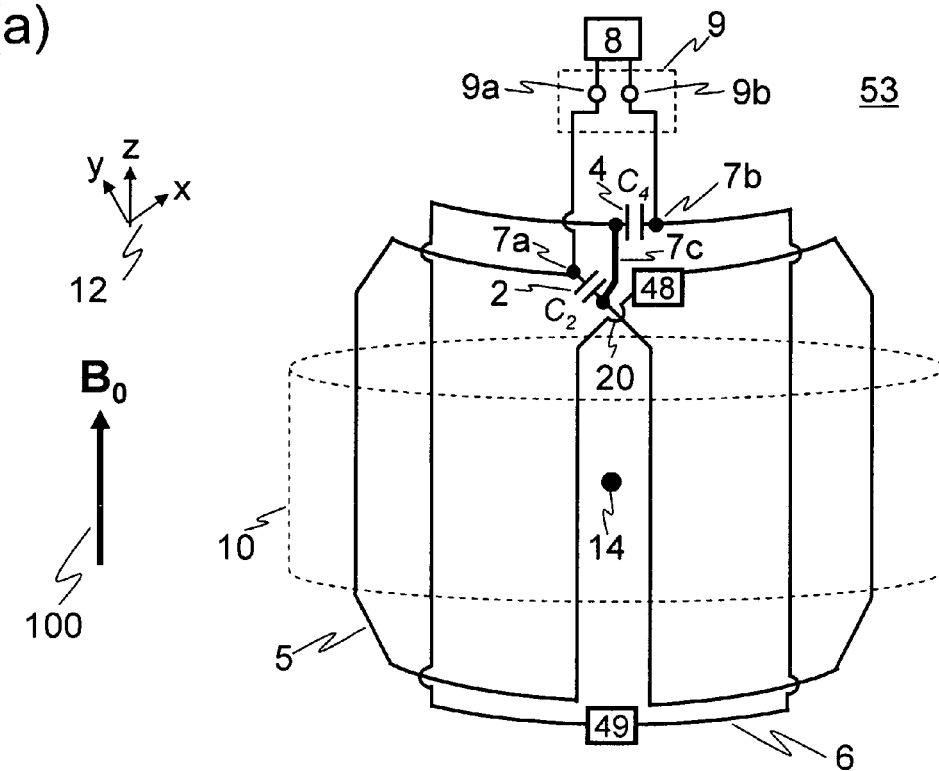
(b)
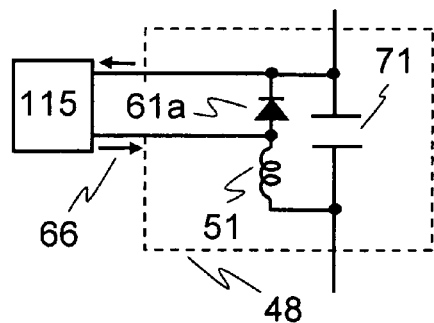
(c)
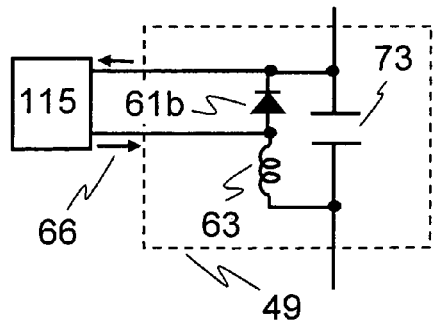

Fig. 21
(a)
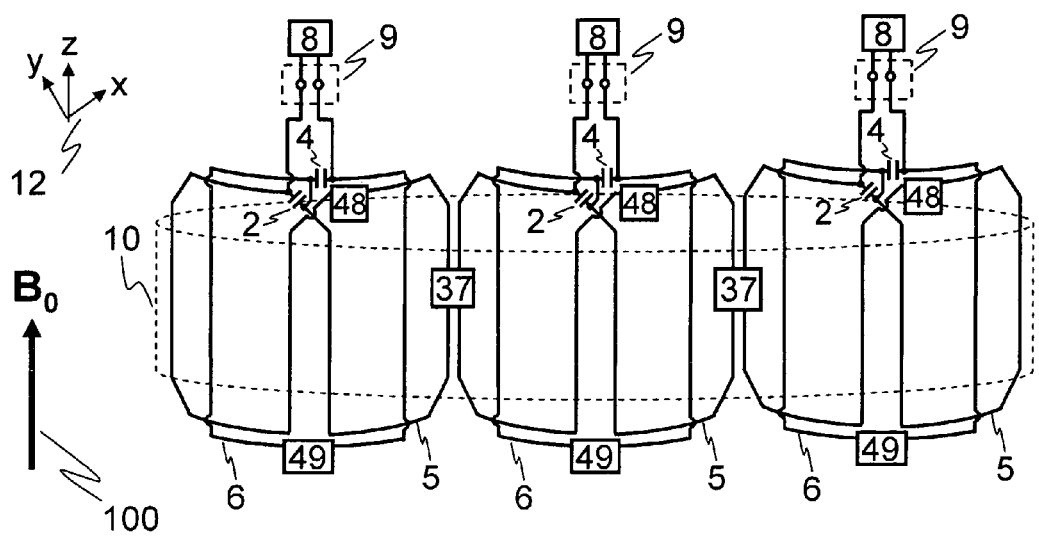
(b)
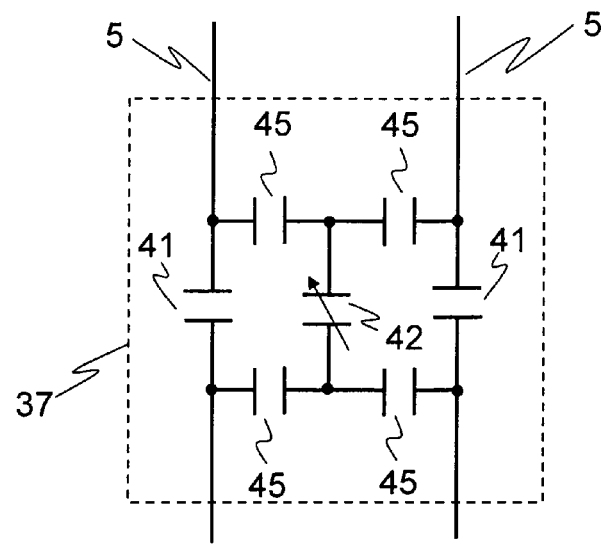

Fig. 23
(a)
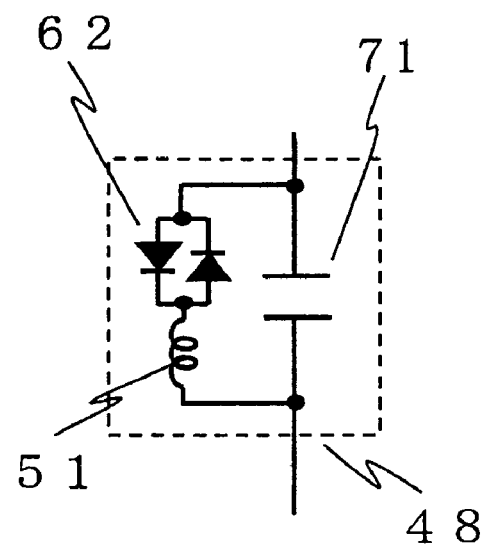
(b)
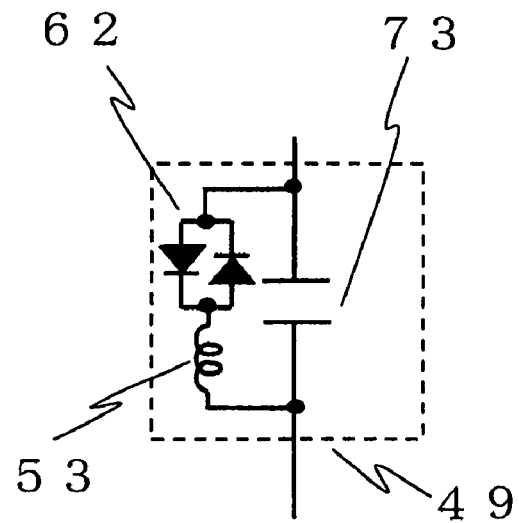

Fig. 25
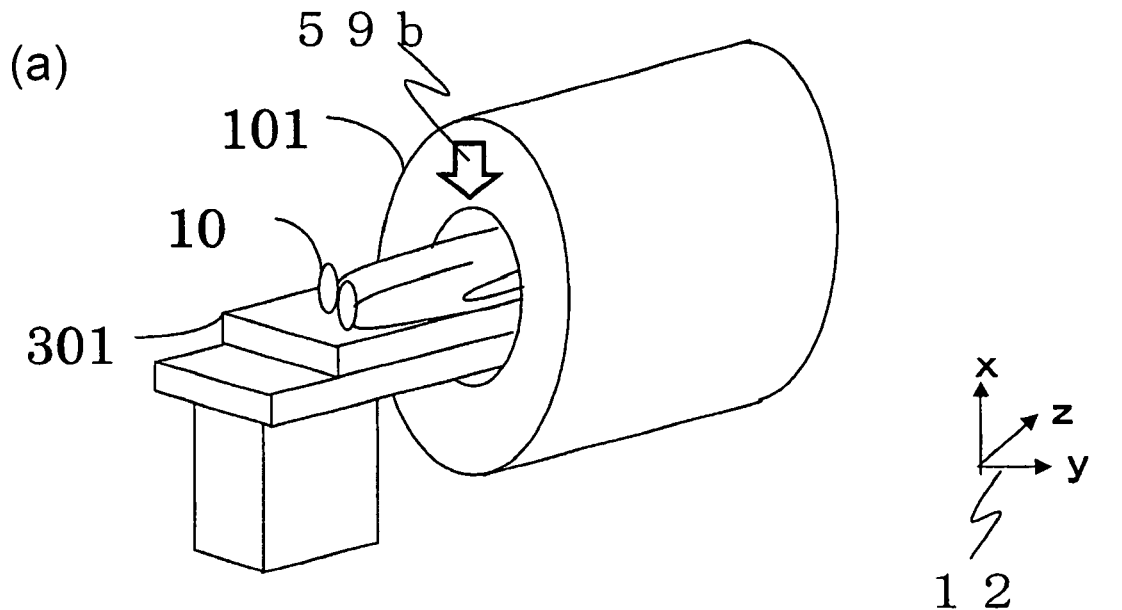
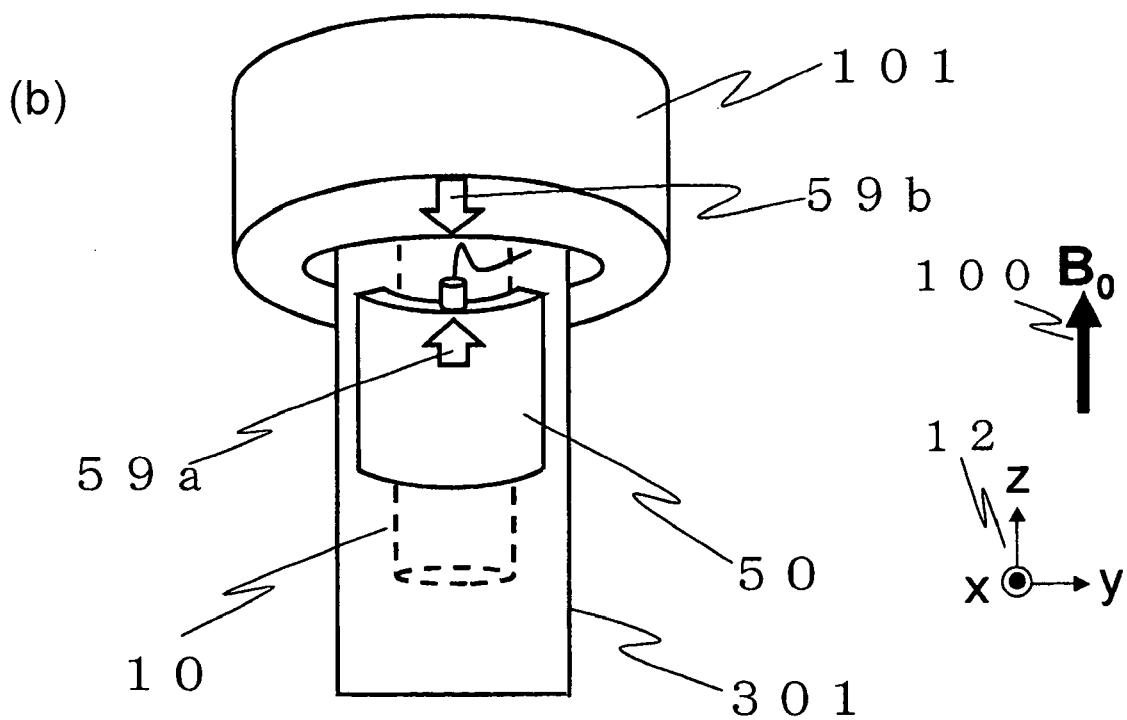

HIGH FREQUENCY COIL AND MAGNETIC RESONANCE IMAGING APPARATUS

CLAIM OF PRIORITY

The present application claims priority from Japanese application JP 2007-187844 filed on Jul. 19, 2007, the content of which is hereby incorporated by reference into this application.

BACKGROUND OF THE INVENTION

1. Field of the Invention

The present invention relates to a magnetic resonance imaging (MRI) apparatus and a high frequency (radio frequency) coil for irradiation of an electromagnetic wave or detection of a magnetic resonance signal.

2. Background Art

An MRI apparatus is a medical diagnostic imaging apparatus that causes magnetic resonance of atomic nuclei in an arbitrary cross section of an inspection target and acquires a tomographic image of the cross section, from the magnetic resonance signal produced in the magnetic resonance. If a living body placed in a static magnetic field is irradiated with a high frequency magnetic field from a high frequency coil (RF coil) while applying a gradient magnetic field to the living body, atomic nuclei in the living body, such as hydrogen nuclei, are excited. The excited hydrogen nuclei generate a circular polarized magnetic field as a magnetic resonance signal when the nuclei are restored to the equilibrium state. The signal is detected by the RF coil and processed to produce an image of the proton distribution in the living body. In order to acquire an image of higher precision and higher resolution, there is a demand for higher irradiation efficiency and higher reception sensitivity of the RF coil used for irradiation of the electromagnetic wave or detection of the magnetic resonance signal.

The quadrature detection (QD) method can improve the irradiation efficiency and reception sensitivity of the RF coil (see Patent Document 1 and Non-Patent Documents 1 and 2, for example). In the QD method, two RF coil disposed so that the axes thereof are perpendicular to each other are used to detect a magnetic resonant signal. The two coils disposed so that the axes thereof are perpendicular to each other are referred to as QD coil. For example, the QD coil may be composed of two loop coils partially overlapping each other (see Non-Patent Document 3, for example). Alternatively, the QD coil may be composed of a loop coil and a figure-of-eight coil (see Non-Patent Document 4, for example).

Since the magnetic resonance signal is a circular polarized magnetic field, when the QD coil detects the magnetic resonance signal, the two RF coils detect signals shifted in phase by 90 degrees. If the two detected signals are combined by shifting the phase of one of the signals by 90 degrees, the signal-to-noise ratio of the signal is ideally improved by a factor of $\sqrt{2}$ compared with the case where the signal is detected by only one RF coil. Furthermore, the power required for irradiation of the high frequency magnetic field is reduced to half, high frequency heat generation of the human body can be reduced.

Non-patent Document 5 discloses a coil that is composed of two loop coils disposed geometrically perpendicularly to each other and one coupling coil disposed to be inductively coupled to each of the two loop coils and is capable of quadrature phase detection by adjusting the degree of coupling between the loop coils and the coupling coil so that the phase difference between the signals detected by the two loop coils is 90 degrees.

[Patent Document 1] JP Patent No. 3095402

[Non-Patent Document 1] C. N. Chen et al., "Quadrature Detection Coils—A further $\sqrt{2}$ Improvement in Sensitivity", Journal of Magnetic Resonance, Vol. 54, pp. 324-327 (1983)

[Non-Patent Document 2] G. H. Glover et al., "Comparison of Linear and Circular Polarization for Magnetic Resonance Imaging", Journal of Magnetic Resonance, Vol. 64, pp. 255-270 (1985)

[Non-Patent Document 3] Zahi A. Fayad et al., "An improved Quadrature or Phased-Array Coil for MR Cardiac Imaging", Magnetic Resonance in Medicine, Vol. 34, pp. 186-193 (1995)

[Non-Patent Document 4] K. Vij et al., "A Quadrature Neck Coil Array", Proceedings of the International Society of Magnetic Resonance in Medicine, Vol. 1994, pp. 1108 (1994)

[Non-Patent Document 5] S. M. Wright, "Circular Polarization from Receiver Coils with a Single Coupling Loop: A simple Technique for Quadrature Detection", Proceedings of Seventh Annual Meeting (Works in Progress) Society of Magnetic Resonance in Medicine, p. 137 (1988)

SUMMARY OF THE INVENTION

According to Patent Document 1, in the QD method, a 90-degree phase shifter is connected to any one of the two coils geometrically angled from each other by 90 degrees, and the output of the 90-degree phase shifter and the output of the other coil are combined by a combiner. That is, in transmission of high frequency signals to the two orthogonal coils, the signals have to be distributed between the feed ports of the two coils, and the phase of the signals distributed to one of the coils has to be shifted in phase. Similarly, in detection of magnetic resonance signals generated by an examinee, the signals have to be received at the two feed ports as circular polarized waves and combined with each other after shifting the phase of one of the signals received at the two feed ports. Therefore, if the transmit coil and the receive coil are both the QD coil, the wiring is installed as shown in FIG. 27. A signal line extending from a transmitter is divided into two by a distributor, and the resulting two signal lines are connected to feed ports of a transmit coil disposed at positions perpendicular to each other, one of which is connected thereto via a phase shifter. Two signal lines extending from two feed ports connected to parts of a receive coil perpendicular to each other are connected to a combiner, one of which is connected thereto via a phase shifter, and combined into one by the combiner, and the resulting one signal line is connected to a receiver.

In this way, in the QD method, the structure of the coils and the wiring are complicated, and a large number of components are required, the adjustment is complicated, and the manufacturing cost is high. Furthermore, the orthogonality of the coils is degraded, and the transmission efficiency and the reception sensitivity of the coils are degraded due to a phase shift occurring in the distributor, the combiner and the phase shifter and a mechanical strain of the coils.

Furthermore, the intensity of the static magnetic field and the magnetic resonance frequency are in proportion to each other, and therefore, the frequency of the signal received by the RF coil increases as the intensity of the magnetic field increases. Since the wavelength of the signal becomes shorter as the frequency increases, In the QD method, the phase shift between the two signals yet to be summed due to the difference in length between the cables or the like is significant, and it is difficult to achieve $\sqrt{2}$ improvement in sensitivity. In addition, adjustment of the length of the cables to adjust the phase shift between the two signals is also difficult.

According to Non-Patent Document 5, the number of feed ports can be reduced to one by using the coupling coil. However, since the loop coils and the coupling coil are inductively coupled to each other, there are problems that a signal loss occurs in the signal transmission from the loop coils to the coupling coil, and the effective sensitivity of the coil decreases and that it is difficult to adjust the degree of inductive coupling with high precision.

The present invention has been made in view of such circumstances, and an object of the present invention is to provide an RF coil of an MRI apparatus capable of generating or detecting a circular polarized magnetic field with a simple structure and a technique for improving the irradiation efficiency and/or the reception sensitivity of the RF coil.

The present invention provides an RF coil that has a set of input/output terminals and two loops. The two loops are disposed and capacitors in the loops are adjusted so that the directions of high frequency magnetic fields generated and detected by the loops are perpendicular to each other, and the combined magnetic field of the high frequency magnetic fields is a circular polarized magnetic field.

More specifically, the present invention provides a high frequency coil for a magnetic resonance imaging apparatus, comprising: a first loop part made of a conductor including a first capacitor and a second capacitor; a second loop part made of a conductor including a third capacitor and a fourth capacitor; an input/output terminal composed of a first terminal and a second terminal; a first joint part that connects the first loop part and the first terminal to each other; a second joint part that connects the second loop part and the second terminal to each other; and a third joint part that connects the first loop part and the second loop part to each other, in which the first joint part and the third joint part are disposed on the opposite ends of the second capacitor, and the second joint part and the third joint part are disposed on the opposite ends of the fourth capacitor, and the first loop part and the second loop part are disposed in such a manner that there is an area in which the direction of a high frequency magnetic field (a first high frequency magnetic field) detected or generated by the first loop part and the direction of a high frequency magnetic field (a second high frequency magnetic field) detected or generated by the second loop part are perpendicular to each other.

According to the present invention, an RF coil of an MRI apparatus can generate or detect a circular polarized magnetic field with a simple structure, and the irradiation efficiency and the reception sensitivity of the RF coil can be improved.

BRIEF DESCRIPTION OF THE DRAWINGS

FIG. 1 includes schematic diagrams of an MRI apparatus according to a first embodiment;

FIG. 3 includes diagrams for illustrating a configuration of a circular polarized RF coil according to the first embodiment;

FIG. 5 includes diagrams for illustrating the impedance characteristics of a serial resonant circuit;

FIG. 7 includes diagrams showing results of simulation of the frequency characteristics of the impedance and the phase of the circular polarized RF coil according to the first embodiment;

FIG. 8 includes a vector diagram of a circular polarized magnetic field generated by the circular polarized RF coil according to the first embodiment and a diagram showing the phase characteristics of the intensity of the circular polarized magnetic field;

FIG. 9 includes diagrams showing a circular polarized RF coil according to a modification of the first embodiment;

FIG. 10 includes a vector diagram of a circular polarized magnetic field generated by the circular polarized RF coil according to the modification of the first embodiment and a diagram showing the characteristics of the intensity and phase of the circular polarized magnetic field;

FIG. 11 includes diagrams showing a configuration of a circular polarized RF coil according to a second embodiment;

FIG. 13 includes diagrams showing a configuration of a circular polarized RF coil according to a third embodiment;

FIG. 14 includes a vector diagram of a circular polarized magnetic field generated by the circular polarized RF coil according to the third embodiment and a diagram showing the characteristics of the intensity and phase of the circular polarized magnetic field;

FIG. 16 includes diagrams showing a configuration of a circular polarized RF coil according to the fourth embodiment;

FIG. 17 includes a vector diagram of a circular polarized magnetic field generated by the circular polarized RF coil according to the fourth embodiment and a diagram showing the characteristics of the intensity and phase of the circular polarized magnetic field;

FIG. 19 includes diagrams showing a configuration of a transmit RF coil according to the fifth embodiment;

FIG. 20 includes diagrams showing a configuration of a receive RF coil according to the fifth embodiment;

FIG. 21 includes diagrams showing a variation of the receive RF coil according to the fifth embodiment;

FIG. 23 includes diagrams showing a variation of a magnetic coupling preventing circuit according to the fifth embodiment;

FIG. 25 includes diagrams showing an example of mounting of the circular polarized RF coil to the MRI apparatus according to the fifth embodiment;

DETAILED DESCRIPTION OF THE PREFERRED EMBODIMENTS

First Embodiment

In the following, a first embodiment of the present invention will be described.

First, a general configuration of an MRI apparatus according to this embodiment will be described. FIG. 1 includes schematic diagrams showing the MRI apparatus according to this embodiment, in which the direction of the z-axis of a coordinate system 12 is the direction of a static magnetic field. FIG. 1(a) shows an MRI apparatus 1000 having a magnet 101 of horizontal magnetic field type, in which an examinee 10 lying on a table 301 is inserted in an imaging space in a bore of the magnet 101, and an image thereof is taken. FIG. 1(b) shows an MRI apparatus 2000 having magnets 201 of vertical magnetic field type, in which the examinee 10 is inserted in an imaging space between a pair of upper and lower magnets 201, and an image thereof is taken. In this embodiment, either the horizontal magnetic field type or the vertical magnetic field type can be used. In the following, as an example, the horizontal magnetic field type will be described.

Figure 2:
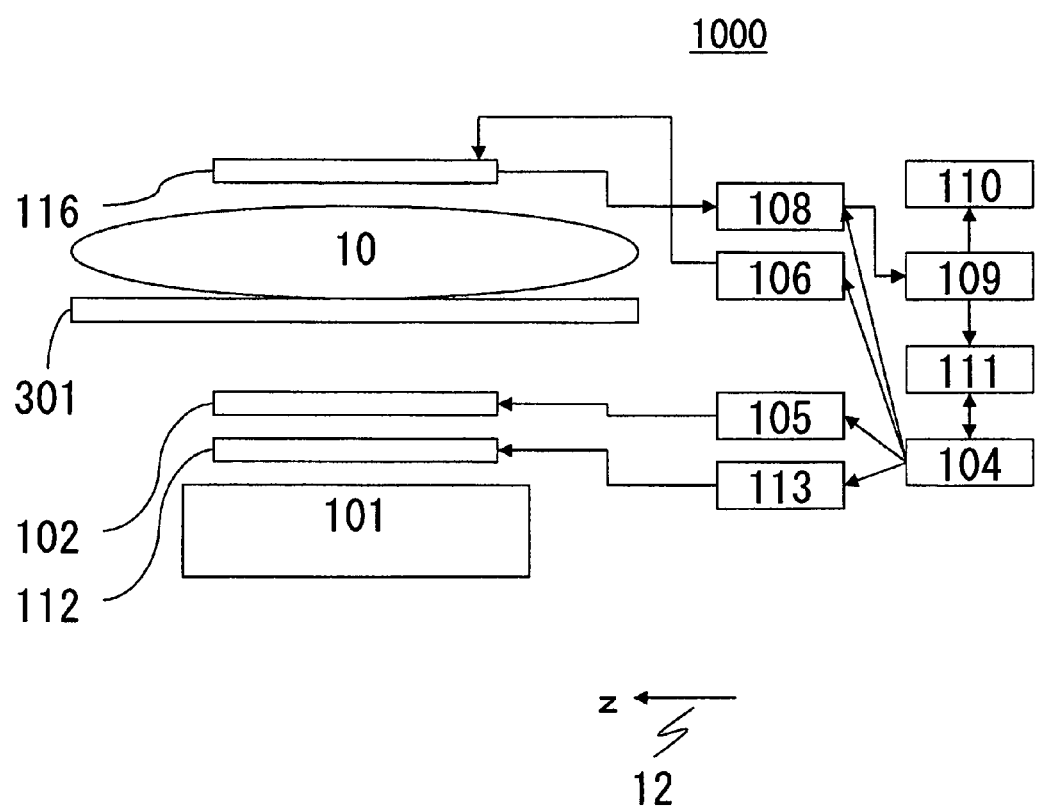
FIG. 2 is a schematic block diagram showing a configuration of the MRI apparatus according to the first embodiment.

FIG. 2 is a schematic block diagram showing a configuration of the MRI apparatus 1000 according to this embodiment. The same parts as those in FIG. 1 are denoted by the same reference numerals. The MRI apparatus 1000 according to this embodiment comprises the magnet 101 of horizontal magnetic field type, a gradient magnetic field coil 102, a shim coil 112 for adjusting the uniformity of a static magnetic field, a sequencer 104, and a transmit-receive RF coil 116 that generates a high frequency magnetic field and receives a magnetic resonance signal. The gradient magnetic field coil 102 and the shim coil 112 are connected to a gradient magnetic field power supply 105 and a shim power supply 113, respectively. The transmit-receive RF coil 116 is connected to a high frequency magnetic field generator 106 and a receiver 108. The sequencer 104 transmits a command to the gradient magnetic field power supply 105, the shim power supply 113 and the high frequency magnetic field generator 106 for generating a gradient magnetic field and a high frequency magnetic field. The high frequency magnetic field is applied to the examinee 10 via the transmit-receive RF coil 116. When the high frequency magnetic field is applied to the examinee 10, the examinee 10 emits a magnetic resonance signal, which is detected by the transmit-receive RF coil 116 and by the receiver 108. The magnetic resonance frequency used as a reference for the detection by the receiver 108 is set by the sequencer 104. The detected signal is transmitted to a computer 109 via an A/D converter, and the computer 109 carries out a signal processing, such as image reconstruction. The result of the signal processing is shown on a display 110. The detected signal and measurement conditions are stored in a storage medium 111, as required. The sequencer 104 controls the operation of each device according to a timing and an intensity previously programmed.

The MRI apparatus 1000 according to this embodiment has a circular polarized RF coil capable of transmitting and receiving a circular polarized magnetic field at one input/output terminal as the transmit-receive RF coil 116. In the following, a circular polarized RF coil used as the transmit-receive RF coil 116 in this embodiment will be described.

FIG. 3 includes diagrams for illustrating a configuration of a circular polarized RF coil 25 according to this embodiment. In this drawing, the direction of a static magnetic field 100 generated by the magnet 101 of horizontal magnetic field type is the direction of the z-axis of the coordinate system 12. FIG. 3(a) shows the circular polarized RF coil 25 viewed from a direction perpendicular to the z-axis, and FIG. 3(b) shows the circular polarized RF coil 25 viewed in the direction of the z-axis (the opposite direction of the static magnetic field 100).

As shown in FIG. 3(a), the circular polarized RF coil 25 according to this embodiment has a first loop part 5 and a second loop part 6 that are made of a conductor, at least one first capacitor 1 and at least one second capacitor 2 that are included in the first loop part 5, at least one third capacitor 3 and at least one fourth capacitor 4 that are included in the second loop part 6, an input/output terminal 9 composed of a first terminal 9a and a second terminal 9b, a signal processing circuit 8, and joint parts 7a, 7b and 7c. The signal processing circuit 8 in this embodiment is a balun (balanced-to-unbalanced transformer) circuit that removes common mode noise. The joint part 7a connects the first loop part 5 to the first terminal 9a, and the joint part 7b connects the second loop part 6 to the second terminal 9b. In the first loop part 5, the joint parts 7a and 7c are connected to the opposite ends of the second capacitor 2. In the second loop part 6, the joint parts 7b and 7c are connected to the opposite ends of the fourth capacitor 4. The first terminal 9a and the second terminal 9b are connected to the signal processing circuit 8. Although not shown in FIG. 3(a), the signal processing circuit 8 is connected to a transmit-receive switch via a coaxial cable, and the transmit-receive switch is connected to the high frequency magnetic field generator 106 and the receiver 108.

The first loop part 5 and the second loop part 6 each have the shape of a loop. The first loop part 5 and the second loop part 6 partially overlap each other, and the overlapping parts thereof are disposed on substantially the same plane. In this regard, the area on the plane defined by the overlapping parts is determined in such a manner that the mutual inductance of the first loop part and the second loop part equal to 0, and the first loop part and the second loop part are not magnetically coupled to each other. As shown in FIG. 3(b), the first loop part 5 and the second loop part 6 are disposed in such a manner that the direction 21 of a first high frequency magnetic field detected and generated by the first loop part 5 and the direction 22 of a second high frequency magnetic field detected and generated by the second loop part are substantially perpendicular to each other.

The circular polarized RF coil 25 thus configured is disposed close to the surface of the examinee 10 having a body axis 11 substantially parallel to the direction of the static magnetic field 100 in such a manner that the straight line connecting a center 13 of the first loop part and a center 14 of the second loop part is at an angle of 90 degrees with respect to the direction of the static magnetic field 100, and the center 14 of the second loop part is rotated counterclockwise by 90 degrees from the center 13 of the first loop part about the body axis 11 of the examinee 10, viewed in the opposite direction of the static magnetic field 100, as shown in FIG. 3(b). In FIG. 3, the inductance and the resistance of the first loop part 5 and the second loop part 6 are not shown.

The inductance ($L_1$) of the inductor and the values ($C_1, C_2$,) of the first capacitor 1 and the second capacitor 2 of the first loop part 5 and the inductance ($L_2$) of the inductor and the values ($C_3, C_4$,) of the third capacitor 3 and the fourth capacitor 4 of the second loop part 6 thus configured according to this embodiment are adjusted so that the circular polarized RF coil 25 detects and generates a circular polarized magnetic field rotating clockwise viewed in the opposite direction of the static magnetic field 100 in the examinee 10 and resonates at a magnetic resonance frequency of a predetermined element. In the following, as an example, a case where a magnetic resonance signal of a proton is transmitted and received will be described. In this example, when the high frequency magnetic field generator 106 applies a high frequency voltage having a central frequency at a magnetic resonance frequency ($f_H$=64 MHz) of a proton at a magnetic field intensity of 1.5 T to the circular polarized RF coil 25, the circular polarized RF coil 25 applies an uniform high frequency magnetic field at a resonance frequency $f_H$ to the examinee 10 as a transmission coil and detects a magnetic resonance signal of protons at a magnetic resonance frequency $f_H$ from the examinee 10 as a receiving coil.

Figure 4:
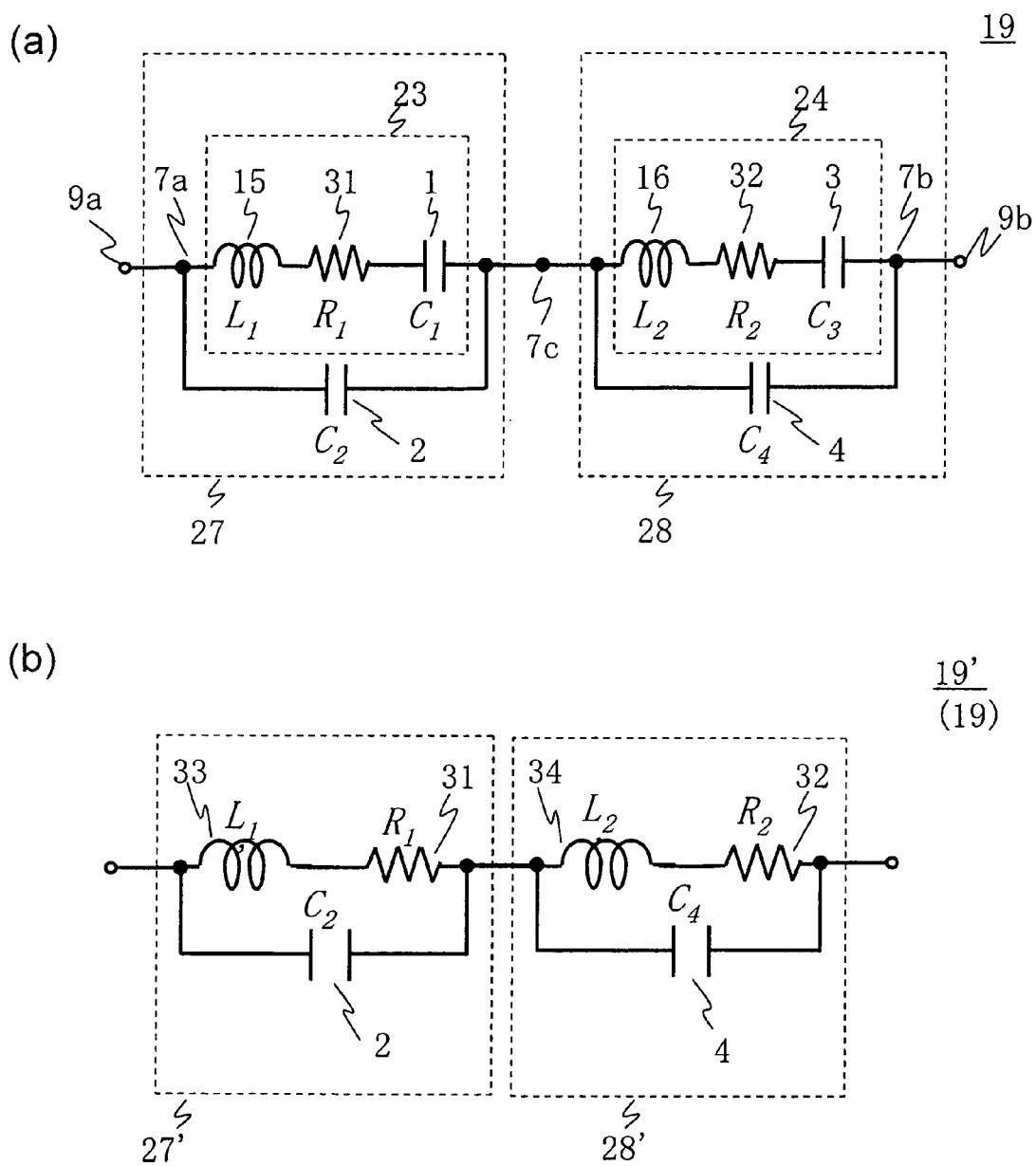
FIG. 4 includes circuit diagrams showing equivalent circuits of the circular polarized RF coil according to the first embodiment.

First, an operation and a characteristic of the circular polarized RF coil 25 in this embodiment will be described with reference to an equivalent circuit. FIG. 4 shows an equivalent circuit 19 of the circular polarized RF coil 25 in this embodiment, viewed from the first terminal 9a and the second terminal 9b.

As shown in FIG. 4(a), the equivalent circuit 19 of the circular polarized RF coil 25 in this embodiment has a first serial-parallel resonant circuit 27, in which a first serial resonant circuit 23 composed of an equivalent inductor 15 of the first loop part 5 (which assumes a value $L_1$ (in the following, characters in parentheses represent values)), a first capacitor 1 ($C_1$) and a resistive component 31 ($R_1$) of the first loop part connected in series to each other and a second capacitor 2 ($C_2$) are connected in parallel to each other, and a second serial-parallel resonant circuit 28, in which a second serial resonant circuit 24 composed of an equivalent inductor 16 of the second loop part ($L_2$), a third capacitor ($C_3$) and a resistive component 32 ($R_2$) of the second loop part connected in series to each other and a fourth capacitor 4 ($C_4$) are connected in parallel to each other, which are connected in series to each other by the joint part 7c. The resistive components 31 ($R_1$) and 32 ($R_2$) are contributed by the resistance of the conductor forming the circular polarized RF coil 25 and the high frequency loss due to the electromagnetic coupling between the examinee 10 and the circular polarized RF coil 25.

An operation (impedance characteristics) of a serial resonant circuit will be described with reference to FIG. 5. As shown in FIG. 5(a), a serial resonant circuit 500 has a capacitor 501 and an inductor 502 connected in series to each other. The impedance Z between the opposite ends of the serial resonant circuit 500 varies with the frequency f of the applied voltage V as shown in FIG. 5(b). Specifically, in the frequency region higher than the resonance frequency $f_{os}$ of the serial resonant circuit 500, the impedance Z tends to increase with frequency and operates as an inductive reactance L'. On the other hand, in the frequency region lower than the resonance frequency $f_{os}$, the impedance Z tends to decrease with frequency and operates as a capacitive reactance C'.

In this example, both the first serial-parallel resonant circuit 27 and the second serial-parallel resonant circuit 28 operate as a parallel resonant circuit, and therefore, the first and second serial resonant circuits operate as an inductive reactance. Therefore, both the resonance frequency $f_{os1}$ of the first serial resonant circuit 23 in FIG. 4(a) and the resonance frequency $f_{os2}$ of the second serial resonant circuit 24 in FIG. 4(a) are set lower than the frequency $f_H$ of the high frequency voltage applied to the equivalent circuit 19 ($f_{os1}$, $f_{os2}$<$f_H$). Therefore, the following relations hold.

[Formula 1]
$$\frac{1}{L_1\omega_H^2} < C_1 \quad \text{(Formula 1)}$$

[Formula 2]
$$\frac{1}{L_2\omega_H^2} < C_3 \quad \text{(Formula 2)}$$

In these formulas, reference character OH denotes the angular frequency ($\omega_H$=2π$f_H$).

If the first capacitor 1 ($C_1$) and the third capacitor 3 ($C_3$) are adjusted so that the formulas 1 and 2 are satisfied, the first serial resonant circuit 23 composed of the equivalent inductor 15 ($L_1$) and the first capacitor 1 ($C_1$) operate as an inductive reactance $L_1'$, and the second serial resonant circuit 24 composed of the equivalent inductor 16 ($L_2$) and the third capacitor 3 ($C_3$) operate as an inductive reactance $L_2'$. In this case, as shown in FIG. 4(b), the equivalent circuit 19 is expressed as an equivalent circuit 19' that has a first parallel resonant circuit 27', in which a serial connection of an inductor 33 ($L_1'$) and a resistive component 31 ($R_1$) and a second capacitor 2 ($C_2$) are connected in parallel to each other, and a second parallel resonant circuit 28', in which a serial connection of an inductor 34 ($L_2'$) and a resistive component 32 ($R_2$) and a fourth capacitor 4 ($C_4$) are connected in parallel to each other, which are connected in series to each other. That is, the equivalent circuit 19 is equivalent to a circuit composed of a serial connection of two parallel resonant circuits having a resistive component.

Figure 6:
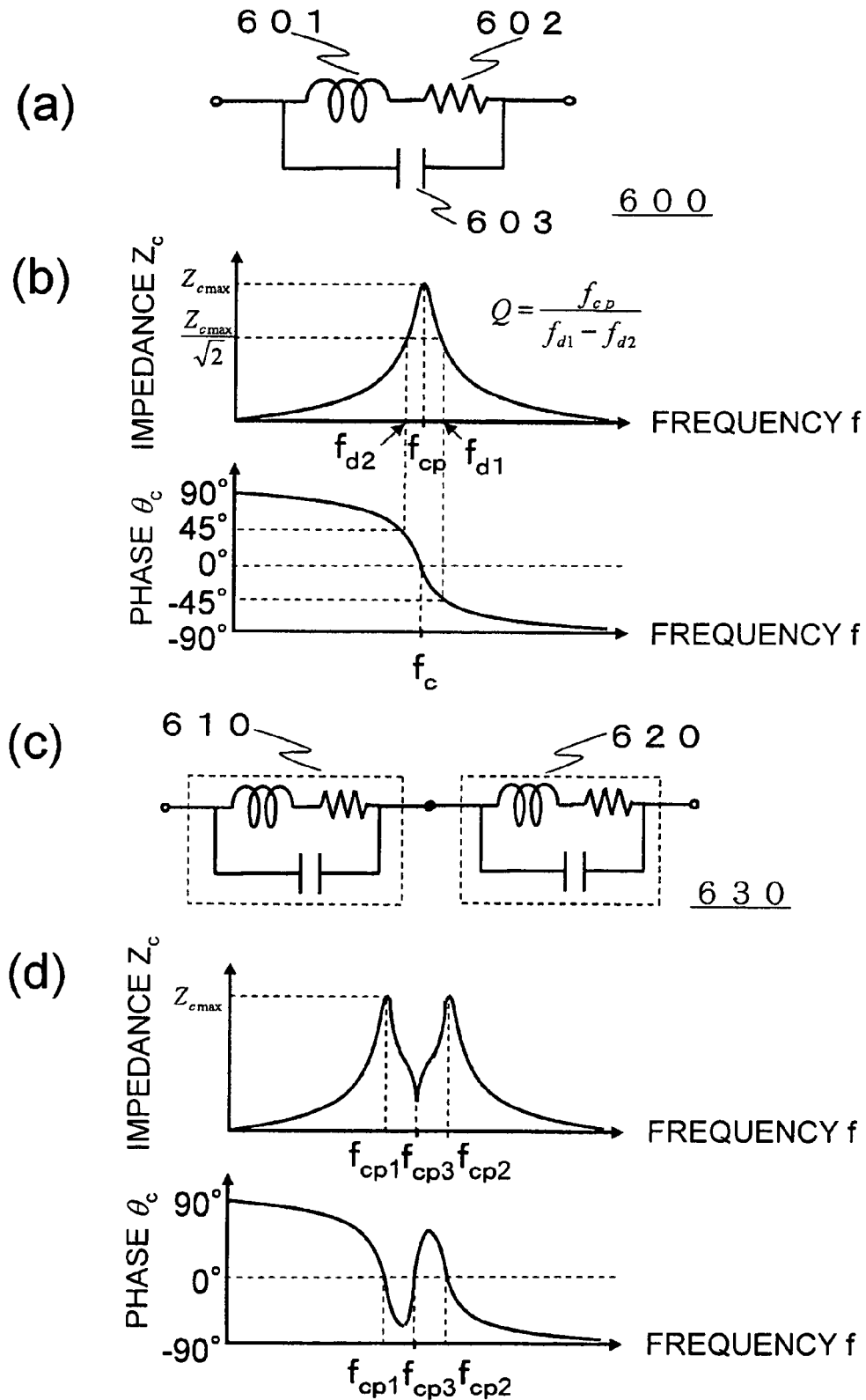
FIG. 6 includes diagrams for illustrating the impedance and the phase of a parallel resonant circuit.

Now, variations in impedance and phase of a parallel resonant circuit having a resistive component will be described with reference to FIG. 6. In general, as shown in FIG. 6(a), a parallel resonant circuit 600 having a resistive component is composed of an inductor 601 and a resistor 602 connected in series to each other and a capacitor 603 connected in parallel thereto. As shown in FIG. 6(b), the magnitude of the impedance $Z_c$ and the phase $\theta_c$ of such a parallel resonant circuit 600 vary with frequency f. The magnitude of the impedance $Z_c$ assumes a maximum value $Z_{cmax}$ at the resonant frequency $f_{cp}$ of the parallel resonant circuit 600. The phase $\theta_c$ assumes positive values at frequencies lower than the resonance frequency $f_{cp}$ and assumes negative values at frequencies higher than the resonance frequency $f_{cp}$.

FIG. 6(c) shows a circuit 630 composed of two parallel resonant circuits 610 and 620 having such characteristics connected in series to each other. FIG. 6(d) shows frequency characteristics of the magnitude of the impedance $Z_c$ and the phase $\theta_c$ of the circuit 630. Here, it is supposed that the resonance frequencies of the parallel resonant circuits 610 and 620 are referred to as first resonance frequency $f_{cp1}$ and second resonance frequency $f_{cp2}$ (>$f_{cp1}$), respectively. The magnitude of the impedance $Z_c$ and the phase $\theta_c$ of the circuit 630 are the compositions of the impedances of the two parallel resonant circuits 610 and 620, respectively. As shown in this drawing, a third resonance point, at which the phase $\theta_c$ is 0 degrees, newly occurs between the first resonance frequency $f_{cp1}$ and the second resonance frequency $f_{cp2}$. The new resonance frequency is referred to as third resonance frequency $f_{cp3}$.

As an example, FIG. 7 shows the frequency characteristics of the impedance 19 and the phase of the equivalent circuit in the case where $L_1=L_2=495$ nH, the values $C_1C_2$, $C_3$ and $C_4$ of the first capacitor 1, the second capacitor 2, the third capacitor 3 and the fourth capacitor 4 are 67 pF, 200 pF, 71 pF and 100 pF, respectively, and $R_1=R_2=0.59\Omega$. The frequency characteristics of the impedance shown in FIG. 7(a) and the frequency characteristics of the phase shown in FIG. 7(b) exhibit similar tendencies to the frequency characteristics of the impedance and the phase shown in FIG. 6(c) and show that the third resonance frequency $f_{cp3}$ occurs.

Here, a high frequency voltage $V_{in}$ having a central frequency at the third resonance frequency $f_{cp3}$ is applied to the equivalent circuit 19 with the resonance frequency of one of the first serial-parallel resonant circuit 27 and the second serial-parallel resonant circuit 28 being set at $f_{cp1}$, and the resonance frequency of the other being set at $f_{cp2}$. In the following, there will be described a case where the resonance frequency of the first serial-parallel resonant circuit 27 is set at $f_{cp1}$, and the resonance frequency of the second serial-parallel resonant circuit 28 is set at $f_{cp2}$.

In this case, the circuit 630 shown in FIG. 6(c) and the equivalent circuit 19' shown in FIG. 4(b) are equivalent to each other, and the phase of the impedance $Z_{19}$ of the equivalent circuit 19 is 0 degrees at the third resonance frequency $f_{cp3}$. Therefore, the phase of a current $I_{in}$ flowing through the equivalent circuit 19 is expressed as $V_{in}=Z_{19}I_{in}$, and therefore the current $I_{in}$ is in phase with the high frequency voltage $V_{in}$. Since $f_{cp1}<f_{cp3}$, the high frequency voltage applied to the first serial-parallel resonant circuit 27 is higher than the resonance frequency of the serial-parallel resonant circuit. Therefore, as can be seen from FIG. 6(b), the phase $\theta_{c1}$ of the impedance $Z_{c1}$ of the first serial-parallel resonant circuit 27 assumes a negative value. Since $V_1=Z_{c1}I_{in}$, the phase of the high frequency voltage $V_1$ applied to the first serial-parallel resonant circuit 27 lags the phase of the high frequency voltage $V_{in}$ by $|\theta_{c1}|$. The phase difference between the current $I_1$ flowing through the inductor 15 ($L_1$) in the first serial-parallel resonant circuit 27 and the high frequency voltage $V_{in}$ is $\theta_{c1}-90$ degrees from a relation: $V_1=(j\omega_{cp3}L_1+(j\omega_{cp3}C_1)^{-1}+R_1)I_1$.

On the other hand, since $f_{cp2}>f_{cp3}$, the high frequency voltage applied to the second serial-parallel resonant circuit 28 is lower than the resonance frequency of the second serial-parallel resonant circuit 28. Therefore, as can be seen from FIG. 6(b), the phase $\theta_{c2}$ of the impedance $Z_{c2}$ of the second serial-parallel resonant circuit 28 assumes a positive value (90 degrees$>\theta_{c2}>0$ degrees). Since $V_2=Z_{c2}I_{in}$, the phase of the high frequency voltage $V_2$ applied to the second serial-parallel resonant circuit 28 leads the phase of the high frequency voltage $V_{in}$ by $|\theta_{c2}|$. The phase difference between the current $I_2$ flowing through the inductor 16 ($L_2$) in the second serial-parallel resonant circuit 28 and the high frequency voltage $V_{in}$ is $\theta_{c2}-90$ degrees from a relation: $V_2=(j\omega_{cp3}L_3+(j\omega_{cp3}C_3)^{-1}+R_2)I_2$. Therefore, in the first serial-parallel resonant circuit 27, a current having a phase difference of $\theta_1=\theta_{c1}-90$ degrees with respect to the high frequency voltage $V_{in}$ occurs, and in the second serial-parallel resonant circuit 28, a current having a phase difference of $\theta_2=\theta_{c2}-90$ degrees with respect to the high frequency voltage $V_{in}$ occurs.

In the equivalent circuit 19, the first serial-parallel resonant circuit 27 is an equivalent circuit of the first loop part 5 of the circular polarized RF coil 25, and the second serial-parallel resonant circuit 28 is an equivalent circuit of the second loop part 6 of the circular polarized RF coil 25. Since the high frequency magnetic field is generated in phase with the high frequency current flowing through the inductor, the first loop part 5 generates a high frequency magnetic field that has a phase difference of $\theta_1=\theta_{c1}-90$ degrees with respect to the high frequency voltage $V_{in}$, and the second loop part 6 generates a high frequency magnetic field that has a phase difference of $\theta_2=\theta_{c2}-90$ degrees with respect to the high frequency voltage $V_{in}$.

As shown in FIG. 3(b), the direction 21 of the first high frequency magnetic field detected and generated by the first loop part 5 and the direction 22 of the second high frequency magnetic field detected and generated by the second loop part 6 are substantially perpendicular to each other. In the case of the QD method, the phase difference between input/output signals of two coils disposed geometrically perpendicularly to each other is adjusted to be 90 degrees. Therefore, to achieve the same advantage as the QD method, the phase difference ($\theta_2-\theta_1$) between the high frequency magnetic field generated by the first loop part 5 and the high frequency magnetic field generated by the second loop part 6 has to be adjusted to be 90 degrees. In addition, according to the reciprocity theorem, the phase difference ($\theta_2-\theta_1$) between the magnetic resonance signal received by the first loop part 5 and the magnetic resonance signal received by the second loop part 6 has to be adjusted to be 90 degrees. Since $\theta_1=\theta_{c1}-90$ degrees and $\theta_2=\theta_{c2}-90$ degrees, and therefore $\theta_2-\theta_1=\theta_{c2}-\theta_{c1}$, $\theta_{c2}-\theta_{c1}$ has to be adjusted to be 90 degrees.

Furthermore, from FIG. 6(c), the phase of the impedance $Z_{19}$ of the equivalent circuit 19 has to be 0 at the frequency $f_{cp3}$. The impedance $Z_{19}$ of the equivalent circuit 19 is the sum of the impedance $Z_{c1}$ of the first serial-parallel resonant circuit and the impedance $Z_{c2}$ of the second serial-parallel resonant circuit, and therefore, the phase of the combined impedance $Z_{c1}+Z_{c2}$ at the frequency $f_{cp3}$ has to be adjusted to be 0 degrees.

In this embodiment, the frequency of the high frequency voltage applied to the equivalent circuit 19 is $f_H$. Therefore, the resonance frequency $f_{cp1}$ of the first serial-parallel resonant circuit 27 is set lower than $f_H$, and the resonance frequency $f_{cp2}$ of the second serial-parallel resonant circuit 28 is set higher than $f_H$ ($f_{cp1}<f_H<f_{cp2}$). The value of each capacitor is adjusted so that, at the frequency $f_H$, the difference between the phase $\theta_{c1}$ of the impedance of the first serial-parallel resonant circuit 27 and the phase $\theta_{c2}$ of the impedance of the second serial-parallel resonant circuit 28 is 90 degrees, and the phase of the impedance $Z_{19}$ of the equivalent circuit 19 is 0 degrees.

Now, there will be described adjustment of the values of the capacitors to make the difference between the phase $\theta_{c1}$ of the impedance $Z_{c1}$ of the first serial-parallel resonant circuit 27 and the phase $\theta_{c2}$ of the impedance $Z_{c2}$ of the second serial-parallel resonant circuit 28 90 degrees and the phase of the impedance $Z_{19}$ of the equivalent circuit 19 0 degrees at the frequency $f_H$. The impedance $Z_{c1}$ of the first serial-parallel resonant circuit 27 and the impedance $Z_{c2}$ of the second serial-parallel resonant circuit 28 are expressed by the following complex numbers, respectively.

$$Z_{c1}=\alpha+j\beta \quad \text{(formula 3)}$$

$$Z_{c2}=\gamma+j\delta \quad \text{(formula 4)}$$

In these formulas, reference character j denotes a pure imaginary number. In this case, for the phases $\theta_{c1}$ and $\theta_{c2}$ of the impedances $Z_{c1}$ and $Z_{c2}$, relations $\tan(\theta_{c1})=\beta/\alpha$ and $\tan(\theta_{c2})=\delta/\gamma$ hold, respectively. From a relation $\tan(\theta_{c2})=\tan(\theta_{c1}+90$ degrees), in order that the relation $\theta_{c2}-\theta_{c1}=90$ degrees holds, $\alpha$, $\beta$, $\gamma$ and $\delta$ have to satisfy the following relation.

[Formula 5]

$$\tan(\theta_{c2}) = \frac{\delta}{\gamma} = -\frac{\alpha}{\beta} \quad \text{(Formula 5)}$$

On the other hand, from the equivalent circuit 19 shown in FIG. 4(a), the impedance $Z_{c1}$ of the first serial-parallel resonant circuit 27 and the impedance $Z_{c2}$ of the second serial-parallel resonant circuit 28 are expressed by the following formulas.

[Formula 6]

$$Z_{c1} = \frac{\omega^2 C_1^2 R_1 - j\omega(\omega^2 C_1^2 R_1^2 + (1-\omega^2 L_1 C_1)(C_1 + (1-\omega^2 L_1 C_1)C_2))}{(\omega^2 C_1 C_2 R_1)^2 + \omega^2 (C_1 + (1-\omega^2 L_1 C_1)C_2)^2} \quad \text{(Formula 6)}$$

[Formula 7]

$$Z_{c2} = \frac{\omega^2 C_3^2 R_2 - j\omega(\omega^2 C_3^2 C_4 R_2^2 + (1-\omega^2 L_2 C_3)(C_3 + (1-\omega^2 L_2 C_3)C_4))}{(\omega^2 C_3 C_4 R_2)^2 + \omega^2 (C_3 + (1-\omega^2 L_2 C_3)C_4)^2} \quad \text{(Formula 7)}$$

In these formulas, reference character $\omega$ denotes the angular frequency.

In order that $\theta_{c2} - \theta_{c1} = 90$ degrees when $\omega = \omega_H$, from the formulas 3, 5 and 6, the capacitances $C_1$ and $C_2$ have to satisfy the following relation.

[Formula 8]

$$C_2 = \frac{\omega_H C_1^2 R_1 - C_1(1-\omega_H^2 L_1 C_1)\tan\theta_{c2}}{(\omega_H C_1 R_1)^2 + (1-\omega_H^2 L_1 C_1)\tan\theta_{c2}} \quad \text{(Formula 8)}$$

Here, the value $R_1$ of the resistive component 31 is expressed as $R_1 = \omega_H L_2/Q_{H1}$. Reference character $Q_{H1}$ denotes the Q value of the first loop part 5 at the frequency $f_H$.

From the formulas 4, 5 and 7, the capacitances $C_3$ and $C_4$ have to satisfy the following relation.

[Formula 9]

$$C_4 = \frac{-\omega_H C_3^2 R_2 \tan\theta_{c2} - C_3(1-\omega_H^2 L_2 C_3)}{(\omega_H C_3 R_2)^2 + (1-\omega_H^2 L_2 C_3)^2} \quad \text{(Formula 9)}$$

Here, the value $R_2$ of the resistive component 32 is expressed as $R_2 = \omega_H L_2/Q_{H2}$. Reference character $Q_{H2}$ denotes the Q value of the second loop part 6 at the frequency $f_H$.

Therefore, if the capacitances $C_1$, $C_2$, $C_3$ and $C_4$ are determined to satisfy the formulas 8 and 9, the relation $\theta_{c2} - \theta_{c1} = 90$ degrees holds.

Next, since $Z_{19} = Z_{c1} + Z_{c2}$, in order that the phase of the impedance $Z_{19}$ at the frequency $f_H$ is 0 degrees, $\beta$ and $\delta$ have to satisfy the following relation at the frequency $f_H$.

$$\beta + \delta = 0 \quad \text{(formula 10)}$$

The magnitude $|Z_{19}|$ of the impedance $Z_{19}$ at the frequency $f_H$ has to be matched with the magnitude $Z_{cc}$ of the characteristic impedance of the signal processing circuit or a cable connected to the input/output terminal 9, and $|Z_{19}| = Z_{cc}$. Furthermore, from the formulas 5 and 10, for the magnitude $|Z_{19}|$ of the impedance $Z_{19}$, the following relation (formula 11) holds.

[Formula 11]

$$|Z_{19}| = \delta\left(\tan\theta_{c2} + \frac{1}{\tan\theta_{c2}}\right) = Z_{cc} \quad \text{(Formula 11)}$$

Here, from the formulas 3, 6 and 8, $\beta$ is expressed by the following formula.

[Formula 12]

$$\beta = \frac{-1}{\omega_H^2 R_1 \tan\theta_{c2}\left(C_2^2 + C_1^2\left(\frac{1-\omega_H C_2 R_1 \tan\theta_{c2}}{(1-\omega_H^2 L_1 C_1)\tan\theta_{c2}}\right)^2\right)} \quad \text{(Formula 12)}$$

From the formulas 4, 7 and 9, $\delta$ is expressed by the following formula.

[Formula 13]

$$\delta = \frac{\tan\theta_{c2}}{\omega_H^2 R_2\left(C_4^2 + C_3^2\left(\frac{\tan\theta_{c2} + \omega_H C_4 R_2}{1-\omega_H^2 L_2 C_3}\right)^2\right)} \quad \text{(Formula 13)}$$

Therefore, from the formula 11, $\delta$ is determined by setting the values of $\theta_{c2}$ and $Z_{cc}$, and from the formulas 9 and 13, the capacitance $C_3$ is determined. Once the capacitance $C_3$ is determined, the capacitance $C_4$ is determined from the formula 9. From the formulas 10 and 11, $\beta$ is determined by setting the values of $\theta_{c2}$ and $Z_{cc}$, and from the formulas 8 and 12, the capacitance $C_1$ is determined. Once the capacitance $C_1$ is determined, the capacitance $C_2$ is determined from the formula 8. Here, the value of $\theta_{c2}$ is set at 45 degrees at which the magnitudes of the impedances $Z_{c1}$ and $Z_{c2}$ are equal to each other.

The Q value $Q_{H1}$ of the first loop part 5 resonating at the resonance frequency $f_H$ and the Q value $Q_{H2}$ of the second loop part 6 resonating at the resonance frequency $f_H$ are determined by measurement. For example, a loop coil having a capacitor inserted therein and having the same dimensions as the first loop part 5 is prepared and placed on a phantom surface equivalent to the examinee 10, the loop coil is made to resonate at the resonance frequency $f_H$ by adjusting the value of the capacitor inserted in the loop coil, and the Q value of the loop coil is measured. The Q value of the second loop part 6 can be determined by similar measurement. Alternatively, the Q values can be determined by electromagnetic field simulation using a model of the electrical characteristics of the circular polarized RF coil 25 and the examinee 10 shown in FIG. 3.

For example, if $L_1$ and $L_2$ are 495 nH, $Q_{H1}$ and $Q_{H2}$ at the resonance frequency $f_H = 64$ MHz are 50, $\theta_{c2} = 45$ degrees, and $Z_{cc} = 200\Omega$, the capacitances $C_1$, $C_2$, $C_3$ and $C_4$ of the first capacitor 1, the second capacitor 2, the third capacitor 3 and the fourth capacitor 4 are adjusted to be 14.5 pF, 75.6 pF, 14.5 pF and 101 pF, respectively.

As described above, if the capacitor 1 ($C_1$) and the capacitor 2 ($C_2$) in the first loop part 5, which is the first serial-parallel resonant circuit 27, and the capacitor 3 ($C_3$) and the capacitor 4 ($C_4$) in the second loop part 6, which is the second serial-parallel resonant circuit 28, are adjusted to satisfy the formulas 1, 2, 8, 9, 10, 11, 12 and 13, as shown in FIG. 3(b), the first loop part 5 generates a first linearly polarized magnetic field in the direction 21 of the first high frequency magnetic field, the second loop part 6 generates a second linearly polarized magnetic field in the direction 22 of the second high frequency magnetic field, and the difference between the phase of the first linearly polarized magnetic field and the phase of the second linearly polarized magnetic field is 90 degrees. Therefore, the high frequency magnetic field generated by the circular polarized RF coil 25 in this embodiment is a composition of the first linearly polarized magnetic field and the second linearly polarized magnetic field.

FIG. 8(a) shows the positional relationship between the first linearly polarized magnetic field and the second linearly polarized magnetic field using vectors. Supposing that the direction 21 of the first high frequency magnetic field is parallel to the x'-axis, and the direction 22 of the second high frequency magnetic field is parallel to the y'-axis, as shown in FIG. 8(b), a vector 17 ($B_1$) of the first linearly polarized magnetic field and a vector 18 ($B_2$) of the second linearly polarized magnetic field at a time t are expressed by the following formulas, respectively.

$$B_1 = (A_1 \sin(\omega t + \theta_1), 0) \quad \text{(formula 14)}$$

$$B_2 = (0, A_2 \sin(\omega t + \theta_2)) \quad \text{(formula 15)}$$

In these formulas, reference characters $A_1$ and $A_2$ denote the amplitudes of the first and second linearly polarized magnetic fields, respectively, reference character $\theta_1$ denotes the phase difference between the high frequency voltage $V_{in}$ and the first linearly polarized magnetic field, and reference character $\theta_2$ denotes the phase difference between the high frequency voltage $V_{in}$ and the second linearly polarized magnetic field. Since $\theta_2 - \theta_1 = 90$ degrees, $B_2 = (0, A_2 \cos(\omega t + \theta_1))$. Since $\theta_{c2} = 45$ degrees, the impedances of the first loop part 5 and the second loop part 6 are equal to each other, and therefore, the amplitudes $A_1$ and $A_2$ of the first and second linearly polarized magnetic fields are equal to each other. Therefore, a composite vector 79 ($B_{12}$) of the vector 17 ($B_1$) of the first linearly polarized magnetic field and the vector 18 ($B_2$) of the second linearly polarized magnetic field is expressed by the following formula, because $B_{12} = B_1 + B_2$.

$$B_{12} = (A_1 \sin(\omega t + \theta_1), A_1 \cos(\omega t + \theta_1)) \quad \text{(formula 16)}$$

As shown in FIG. 8(b), from the formula 16, the vector 79 ($B_{12}$) has a magnitude of $\sqrt{2}A_1$ and forms an angle of ($\omega t + \theta_1$) degrees with respect to the y'-axis. As the time t increases, the vector 79 ($B_{12}$) rotates clockwise about the origin of the x'-axis and the y'-axis while maintaining the magnitude thereof. That is, the high frequency magnetic field generated or detected by the circular polarized RF coil 25 is a circular polarized magnetic field.

As described above, the circular polarized RF coil 25 in this embodiment generates a circular polarized magnetic field rotating clockwise viewed in the opposite direction of the static magnetic field 100 in the examinee 10 and applies a high frequency magnetic field to the examinee 10 with high efficiency if the values $C_1$, $C_2$, $C_3$ and $C_4$ of the first capacitor 1, the second capacitor 3, the third capacitor 3 and the fourth capacitor 4 are adjusted so that the formulas 1, 2, 8, 9, 10, 11, 12 and 13 are satisfied. By the reciprocity theorem, the circular polarized RF coil 25 can resonate at the frequency $f_H$ and detect the circular polarized magnetic field rotating clockwise viewed in the opposite direction of the static magnetic field 100 with high efficiency. Therefore, after application of the high frequency magnetic field, a magnetic resonance signal at the frequency $f_H$ is emitted from the examinee 10 in the form of a circular polarized magnetic field rotating clockwise viewed in the opposite direction of the static magnetic field 100. Therefore, the circular polarized RF coil 25 detects the magnetic resonance signal of a proton with high efficiency. In this way, the circular polarized RF coil 25 shown in FIG. 8 operates as transmit-receive coil for the magnetic resonance signal of a proton.

As described above, the RF coil according to this embodiment can transmit and receive a circular polarized high frequency magnetic field having high signal-to-noise ratio and high uniformity by itself, as with the QD method in which two RF coils are used to generate a circular polarized magnetic field. Therefore, compared with the QD method, the number of coils and wiring systems is reduced by one. Therefore, the distributor and the phase shifter are not necessary, and the number of components of the transmission system is reduced to half or less. Therefore, the transmission system can be more easily adjusted, and the manufacturing cost can be reduced. In addition, since there is only one input/output terminal of the coil, and the distributor and the phase shifter are not used, the degradation of the orthogonality due to the mechanical strain of the coil, and the degradation of the signal-to-noise ratio of the coil due to the phase shift in the distributor and the phase shifter can be reduced. Thus, compared with the prior art, the transmission efficiency and the reception sensitivity of the coil are improved.

In this embodiment, the first loop part 5 and the second loop part 6 are disposed in such a manner that the straight line connecting the center 13 of the first loop part 5 and the center 14 of the second loop part 6 forms an angle of 90 degrees with respect to the direction of the static magnetic field 100. This is an example in which the normalized sensitivity of the circular polarized RF coil 25 shown in FIG. 3 is maximized. The angle is not always limited to 90 degrees. The normalized sensitivity means the sensitivity divided by the maximum value of the sensitivity.

Supposing that the angle between the straight line connecting the center 13 of the first loop part 5 and the center 14 of the second loop part 6 and the direction of the static magnetic field 100 is denoted by reference character $\phi$, the normalized sensitivity S of the circular polarized RF coil 25 shown in FIG. 3 is expressed as $S = |\sin(\phi)|$. Therefore, when $\phi = 90$ degrees, the normalized sensitivity S is maximized. The normalized sensitivity is equal to or higher than 95% of the maximum value thereof when the angle $\phi$ is equal to or higher than 72 degrees and equal to or lower than 108 degrees. Therefore, the angle between the straight line connecting the center 13 of the first loop part 5 and the center 14 of the second loop part 6 and the direction of the static magnetic field 100 in this embodiment is desirably equal to or higher than 72 degrees and equal to or lower than 108 degrees and is most desirably about 90 degrees. Here, the term "about" is used to mean the error range of the angle due to the manufacturing error of the coil.

In this embodiment, the first loop part 5 and the second loop part 6 are disposed as shown in FIG. 3. However, the arrangement of the capacitors in each loop part and the arrangement of the loops are not limited to that shown in FIG. 3. Any arrangement of the first loop part 5 and the second loop part 6 is possible as far as the high frequency magnetic field formed by combining the first linearly polarized magnetic field and the second linearly polarized magnetic field is a circular polarized magnetic field in the examinee 10 that rotates clockwise viewed in the opposite direction of the static magnetic field 100.

As an example, FIG. 9 shows a modification of the circular polarized RF coil 25 shown in FIG. 3 (a circular polarized RF coil 25A). FIG. 9(a) shows the circular polarized RF coil 25A viewed from a direction perpendicular to the z-axis. FIG. 9(b) shows the circular polarized RF coil 25A viewed in the direction of the z-axis (the opposite direction of the static magnetic field 100). Unlike the circular polarized RF coil 25 shown in FIG. 3, as shown in these drawings, the center 14 of the second loop part is rotated clockwise by 90 degrees from the center 13 of the first loop about the body axis 11 of the examinee 10, viewed in the opposite direction of the static magnetic field 100.

The circular polarized RF coil 25A in this modification is also represented by the equivalent circuit 19 shown in FIG. 4. However, in the circular polarized RF coil 25A, the second capacitor 2 ($C_2$) is disposed inside the second loop part 6. The direction of the current flowing through the first loop part 5 when the difference ($V_{7a}-V_{7c}$) between the potential at the joint part 7a and the potential $V_{7c}$ at the joint part 7c is positive is the same between the circular polarized RF coil 25 shown in FIG. 3 and the circular polarized RF coil 25A shown in FIG. 9. However, in the arrangement shown in FIG. 9(a), the direction of the current flowing through the second loop part 6 is opposite to that in the arrangement shown in FIG. 3. Therefore, if a high frequency voltage is applied to the circular polarized RF coil 25A, as shown in FIG. 9(b), the direction 22A of the second high frequency magnetic field generated by the second loop part 6 is opposite to that in the circular polarized RF coil 25 shown in FIG. 3.

In this case, as shown in FIG. 10(a), the high frequency magnetic field generated by the first loop part 5 and the second loop part 6 is a composition of the vector 17 ($B_1$) of the first linearly polarized magnetic field parallel to the direction 21 of the first high frequency magnetic field and the vector 18 ($B_2$) of the second linearly polarized magnetic field parallel to the direction 22A of the second high frequency magnetic field. Supposing that the direction 21 of the first high frequency magnetic field is parallel to the x'-axis, and the direction 22A of the second high frequency magnetic field is parallel to the y'-axis, as shown in FIG. 10(b), the positional relationship between the vector 17 ($B_1$) of the first linearly polarized magnetic field and the vector 18 ($B_2$) of the second linearly polarized magnetic field is the same as the positional relationship between the linearly polarized magnetic fields shown in FIG. 8(b). Therefore, the vector 79 formed by combining the vector 17 ($B_1$) of the first linearly polarized magnetic field and the vector 18 ($B_2$) of the second linearly polarized magnetic field rotates clockwise about the origin of the x'-axis and the y'-axis while maintaining the magnitude thereof. That is, the high frequency magnetic field generated and detected by the circular polarized RF coil 25A is a circular polarized magnetic field.

From the above description, the circular polarized RF coil 25A shown in FIG. 9 generates a circular polarized magnetic field rotating clockwise viewed in the opposite direction of the static magnetic field 100 in the examinee 10 and applies a high frequency magnetic field to the examinee 10 with high efficiency at the frequency $f_H$ if the values $C_1$, $C_2$, $C_3$ and $C_4$ are adjusted so that the formulas 1 and 2 and the formulas 8 to 13 are all satisfied. After application of the high frequency magnetic field, when a magnetic resonance signal at the frequency $f_H$ is emitted from the examinee 10 in the form of a circular polarized magnetic field rotating clockwise viewed in the opposite direction of the static magnetic field 100, according to the reciprocity theorem, the circular polarized RF coil 25A resonates at the frequency $f_H$ and can detect the circular polarized magnetic field rotating clockwise viewed in the opposite direction of the static magnetic field 100 with high efficiency. Thus, the circular polarized RF coil 25A shown in FIG. 9 operates as a transmit-receive coil for the magnetic resonance signal of a proton.

Second Embodiment

Now, a second embodiment of the present invention will be described. An MRI apparatus according to this embodiment is essentially the same as that according to the first embodiment. However, unlike the circular polarized RF coil according to the first embodiment composed of two loop coils, a circular polarized RF coil according to this embodiment is composed of a loop coil and a figure-of-eight coil. In the following, differences from the first embodiment will be described. In this embodiment also, the direction of a static magnetic field 100 generated by a magnet 101 of horizontal magnetic field type is the same as the direction of the z-axis of a coordinate system 12.

FIG. 11 includes diagrams for illustrating a configuration of a circular polarized RF coil 252 according to this embodiment. FIG. 11(a) shows the circular polarized RF coil 252 viewed from a direction perpendicular to the z-axis, and FIG. 11(b) shows the circular polarized RF coil 252 viewed in the direction of the z-axis (the opposite direction of the static magnetic field 100).

As shown in FIG. 11(a), the circular polarized RF coil 252 according to this embodiment has a first loop part 5 and a second loop part 6 that are made of a conductor, at least one first capacitor 1 and at least one second capacitor 2 that are included in the first loop part 5, at least one third capacitor 3 and at least one fourth capacitor 4 that are included in the second loop part 6, joint parts 7a, 7b and 7c that connect the second capacitor 2 and the fourth capacitor 4 in series to each other, a signal processing circuit 8, and an input/output terminal 9 composed of a first terminal 9a and a second terminal 9b. In this embodiment also, the signal processing circuit 8 is a balun (balanced-to-unbalanced transformer) circuit that removes common mode noise. The joint part 7a connects the first loop part 5 to the first terminal 9a, and the joint part 7b connects the second loop part 6 to the second terminal 9b. In the first loop part 5, the joint parts 7a and 7c are connected to the opposite ends of the second capacitor 2. In the second loop part 6, the joint parts 7b and 7c are connected to the opposite ends of the fourth capacitor 4. The first terminal 9a and the second terminal 9b are connected to the signal processing circuit 8. Although not shown in FIG. 11(a), the signal processing circuit 8 is connected to a transmit-receive switch via a coaxial cable, and the transmit-receive switch is connected to the high frequency magnetic field generator 106 and the receiver 108.

As in the first embodiment, the circuit 19 shown in FIG. 4 is an equivalent circuit of the circular polarized RF coil 252 according to this embodiment. However, in the circular polarized RF coil 252 according to this embodiment, the first loop part 5 has the shape of a figure-of-eight coil, and the second loop part 6 has the shape of a loop. The dimensions and the arrangement of the first loop part 5 and the second loop part 6 are adjusted to prevent magnetic coupling between the first loop part and the second loop part, and the first loop part and the second loop part are partially disposed on substantially the same plane. Furthermore, the first loop part 5 and the second loop part 6 are disposed to reduce the length of the joint part 7c so that the equivalent inductance of the joint part 7c is equal to or less than a hundredth of the inductance of the first loop part and the second loop part.

As shown in FIG. 11(b), the first loop part 5 disposed as described above detects and generates a loop-shaped magnetic field 58 that penetrates through the two coil sections forming the figure-of-eight first loop part 5. The direction 12 indicates the direction of the high frequency magnetic field generated by the first loop part 5 in the vicinity of the center of an examinee 10. On the other hand, the second loop part 6 detects and generates a linear high frequency magnetic field, the direction of which is indicated by the direction 22. That is, the direction 21 of a first high frequency magnetic field detected and generated by the first loop part 5 and the direction 22 of a second high frequency magnetic field detected and generated by the second loop part 6 are perpendicular to each other in an interior 26 of the examinee 10.

The circular polarized RF coil 252 thus configured is disposed close to the surface of the examinee 10 having a body axis 11 substantially parallel to the direction of the static magnetic field 100 in such a manner that the straight line connecting a center 14 of the second loop part and an intersection 20 of the coil sections of the figure-of-eight first loop part is substantially parallel to the direction of the static magnetic field 100. In addition, the second capacitor 2, the fourth capacitor 4 and the joint parts 7a, 7b and 7c are connected so that the circular polarized RF coil 252 generates or detects a circular polarized magnetic field rotating clockwise viewed in the opposite direction of the static magnetic field 100 in the examinee 10. In FIG. 11, the inductance of the first loop part 5 and the second loop part 6 is not shown.

The inductance ($L_1$) of the inductor and the values ($C_1, C_2$,) of the first capacitor 1 and the second capacitor 2 of the first loop part 5 and the inductance ($L_2$) of the inductor and the values ($C_3, C_4$,) of the third capacitor 3 and the fourth capacitor 4 of the second loop part 6 thus configured according to this embodiment are adjusted so that the circular polarized RF coil 252 detects and generates a circular polarized magnetic field rotating clockwise viewed in the opposite direction of the static magnetic field 100 in the interior 26 of the examinee 10 and resonates at a magnetic resonance frequency of a predetermined element. In the following, as with the first embodiment, in this embodiment also, a case where a magnetic resonance signal of a proton is transmitted and received will be described, as an example. That is, there will be described in detail a case where the high frequency magnetic field generator 106 applies a high frequency voltage having a central frequency at a magnetic resonance frequency $f_H$ ($f_H$=64 MHz) of a proton at a magnetic field intensity of 1.5 T to the circular polarized RF coil 252 in this embodiment, the circular polarized RF coil 252 applies a high frequency magnetic field at a resonance frequency $f_H$ to the examinee 10 with high efficiency as a transmission coil and detects a magnetic resonance signal of a proton at a magnetic resonance frequency $f_H$ from the examinee 10 as a receiving coil.

In the case where a high frequency voltage having the center frequency at the frequency $f_H$ transmitted from the high frequency magnetic field generator 106 is applied to the circular polarized RF coil 252, the equivalent circuit of the circular polarized RF coil 252 in this embodiment shown in FIG. 11 viewed from the first terminal 9a and the second terminal 9b is the equivalent circuit 19 shown in FIG. 4, as in the first embodiment. That is, the equivalent circuit is a series connection of a first serial-parallel resonant circuit 27, in which a first serial resonant circuit 23 composed of an equivalent inductor 15 of the first loop part 5, a first capacitor and a resistive component 31 of the first loop part connected in series to each other and a second capacitor 2 are connected in parallel to each other, and a second serial-parallel resonant circuit 28, in which a second serial resonant circuit 24 composed of an equivalent inductor 16 of the second loop part 6, a third capacitor and a resistive component 32 of the second loop part connected in series to each other and a fourth capacitor 4 are connected in parallel to each other.

Therefore, the circular polarized RF coil 252 in this embodiment resonates at the resonance frequency $f_H$ if the values $C_1, C_2, C_3$ and $C_4$ of the first capacitor 1, the second capacitor 2, the third capacitor 3 and the fourth capacitor 4 are adjusted so that the formulas 1 and 2 and the formulas 8 to 13 are all satisfied.

Figure 12:
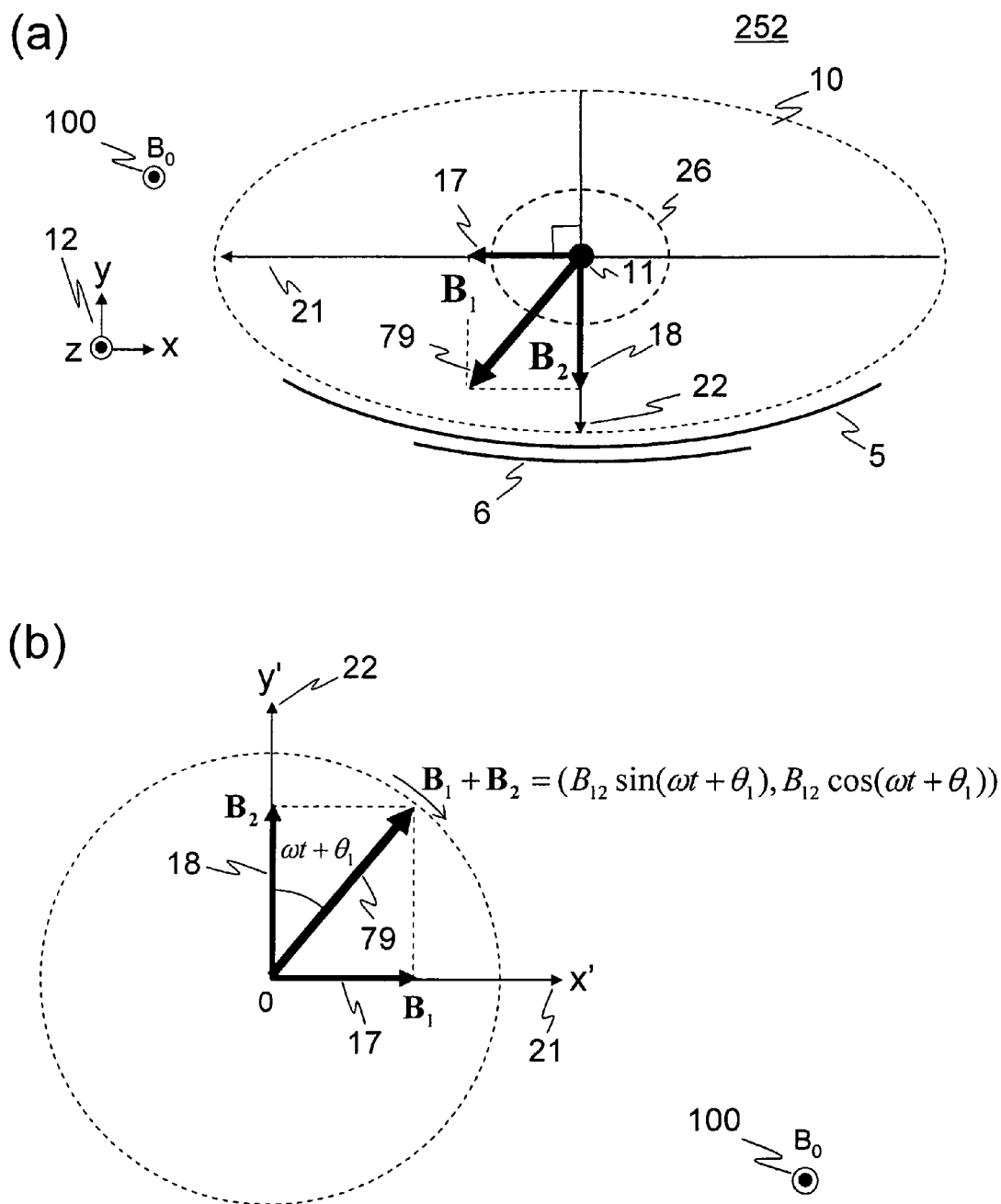
FIG. 12 includes a vector diagram of a circular polarized magnetic field generated by the circular polarized RF coil according to the second embodiment and a diagram showing the characteristics of the intensity and phase of the circular polarized magnetic field.

If the examinee 10 and the circular polarized RF coil 252 are disposed as shown in FIG. 11, and a high frequency voltage at the resonance frequency $f_H$ is applied to the circular polarized RF coil 252, as shown in FIG. 11(b), the first loop part 5 generates a first linearly polarized magnetic field in the direction 21 of the first high frequency magnetic field, and the second loop part 6 generates a second linearly polarized magnetic field in the direction 22 of the second high frequency magnetic field, and the difference between the phase of the first linearly polarized magnetic field and the phase of the second linearly polarized magnetic field is 90 degrees. Therefore, as shown in FIG. 12(a), the high frequency magnetic field generated by the circular polarized RF coil 252 in this embodiment is a composition of the vector 17 ($B_1$) of the first linearly polarized magnetic field parallel to the direction 21 of the first high frequency magnetic field and the vector 18 ($B_2$) of the second linearly polarized magnetic field parallel to the direction 22 of the second high frequency magnetic field. Supposing that the direction 21 of the first high frequency magnetic field is parallel to the x'-axis, and the direction 22 of the second high frequency magnetic field is parallel to the y'-axis, as shown in FIG. 12(b), the positional relationship between the vector 17 ($B_1$) of the first linearly polarized magnetic field and the vector 18 ($B_2$) of the second linearly polarized magnetic field is the same as the positional relationship between the linearly polarized magnetic fields shown in FIG. 8(b). Therefore, the vector 79 formed by combining the vector 17 ($B_1$) of the first linearly polarized magnetic field and the vector 18 ($B_2$) of the second linearly polarized magnetic field rotates clockwise about the origin of the x'-axis and the y'-axis while maintaining the magnitude thereof. That is, the high frequency magnetic field generated and detected by the circular polarized RF coil 252 is a circular polarized magnetic field.

As described above, the circular polarized RF coil 252 in this embodiment generates a circular polarized magnetic field rotating clockwise viewed in the opposite direction of the static magnetic field 100 in the examinee 10 and applies a high frequency magnetic field to the examinee 10 with high efficiency at the frequency $f_H$ if the values $C_1, C_2, C_3$ and $C_4$ are adjusted so that the formulas 1 and 2 and the formulas 8 to 13 are all satisfied. After application of the high frequency magnetic field, when a magnetic resonance signal at the frequency $f_H$ is emitted from the examinee 10 in the form of a circular polarized magnetic field rotating clockwise viewed in the opposite direction of the static magnetic field 100, by the reciprocity theorem, the circular polarized RF coil 252 can resonate at the frequency $f_H$ and detect the circular polarized magnetic field rotating clockwise viewed in the opposite direction of the static magnetic field 100 with high efficiency.

In this way, the circular polarized RF coil 252 shown in FIG. 11 operates as transmit-receive coil for the magnetic resonance signal of a proton.

As described above, the RF coil according to this embodiment can transmit and receive a circular polarized high frequency magnetic field having high signal-to-noise ratio and high uniformity by itself, as with the QD method in which two RF coils are used to generate a circular polarized magnetic field. Therefore, compared with the QD method, the number of coils and wiring systems is reduced by one. Therefore, the distributor and the phase shifter are not necessary, and the number of components of the transmission system is reduced to half or less. Therefore, the transmission system can be more easily adjusted, and the manufacturing cost can be reduced. In addition, since there is only one input/output terminal of the coil, and the distributor and the phase shifter are not used, the degradation of the orthogonality due to the mechanical strain of the coil, and the degradation of the signal-to-noise ratio of the coil due to the phase shift in the distributor and the phase shifter can be reduced. Thus, compared with the prior art, the transmission efficiency and the reception sensitivity of the coil are improved. In addition, in the circular polarized RF coil 252 in this embodiment, the direction of the magnetic field generated/detected by the first loop part 5 having the shape of a figure eight and the direction of the magnetic field generated/detected by the second loop part 6 having the shape of a rectangular loop are perpendicular to each other in a deep portion of the examinee 10. Therefore, compared with the circular polarized RF coil 25 in the first embodiment, the sensitivity at the deep portion of the examinee 10 that has a flat surface is improved, and the sensitivity in the center region of the trunk of the examinee 10 is improved.

In this embodiment, the first loop part 5 and the second loop part 6 are disposed in such a manner that the center 14 of the second loop part 6 lies on the straight line that is substantially parallel to the direction of the static magnetic field 100 and passes thorough the intersection 20 of the coil sections of the figure-of-eight first loop part 5. That is, in the case where the center 14 and the intersection 20 are located at different positions, the first loop part 5 and the second loop part 6 are disposed so that the straight line connecting the center 14 of the second loop part 6 and the intersection 20 of the coil sections of the figure-of-eight first loop part 5 is substantially parallel to the direction of the static magnetic field 100. This is an example in which the normalized sensitivity of the circular polarized RF coil 252 in this embodiment is maximized. However, the present invention is not necessarily limited thereto.

Supposing that the angle between the straight line connecting the center 14 of the second loop part 6 and the intersection 20 of the coil sections of the figure-of-eight first loop part 5 and the direction of the static magnetic field 100 is denoted by reference character $\phi$, the normalized sensitivity S of the circular polarized RF coil 252 is expressed as $S=|\cos(\phi)|$. Therefore, when the angle between the straight line connecting the intersection 20 of the coil sections of the figure-of-eight first loop part 5 and the center 14 of the second loop part 6 and the direction of the static magnetic field 100 is 0 degrees, the normalized sensitivity S is maximized. The normalized sensitivity is equal to or higher than 95% of the maximum value thereof when the angle $\phi$ is equal to or higher than 0 degrees and equal to or lower than 18 degrees. Therefore, the angle between the straight line connecting the intersection 20 of the coil sections of the figure-of-eight first loop part 5 and the center 14 of the second loop part 6 and the direction of the static magnetic field 100 is desirably equal to or higher than 0 degrees and equal to or lower than 18 degrees and is most desirably about 0 degrees. If the angle is about 0 degrees, the straight line connecting the center 14 of the second loop part 6 and the intersection 20 of the coil sections of the figure-of-eight first loop part 5 is substantially parallel to the direction of the static magnetic field 100. Here, the term "about" is used to mean the error range of the angle due to the manufacturing error of the coil.

Third Embodiment

Now, a third embodiment of the present invention will be described. An MRI apparatus according to this embodiment is essentially the same as that according to the first embodiment. However, unlike the circular polarized RF coil according to the first embodiment composed of two loop coils, a circular polarized RF coil according to this embodiment is composed of two saddle-type coils. In the following, differences from the first embodiment will be described. In this embodiment also, the direction of a static magnetic field 100 generated by a magnet 101 of horizontal magnetic field type is the same as the direction of the z-axis of a coordinate system 12.

FIG. 13 includes diagrams for illustrating a configuration of a circular polarized RF coil 253 according to this embodiment. FIG. 13(a) shows the circular polarized RF coil 253 viewed from a direction perpendicular to the z-axis, and FIG. 13(b) shows the circular polarized RF coil 253 viewed in the direction of the z-axis (the opposite direction of the static magnetic field 100).

As shown in FIG. 13(a), the circular polarized RF coil 253 according to this embodiment has a first loop part 5 and a second loop part 6 that are made of a conductor, at least one first capacitor 1 and at least one second capacitor 2 that are included in the first loop part 5, at least one third capacitor 3 and at least one fourth capacitor 4 that are included in the second loop part 6, joint parts 7a, 7b and 7c that connect the second capacitor 2 and the fourth capacitor 4 in series to each other, a signal processing circuit 8, and an input/output terminal 9 composed of a first terminal 9a and a second terminal 9b. In this embodiment also, the signal processing circuit 8 is a balun (balanced-to-unbalanced transformer) circuit that removes common mode noise. The joint part 7a connects the first loop part 5 to the first terminal 9a, and the joint part 7b connects the second loop part 6 to the second terminal 9b. In the first loop part 5, the joint parts 7a and 7c are connected to the opposite ends of the second capacitor 2. In the second loop part 6, the joint parts 7b and 7c are connected to the opposite ends of the fourth capacitor 4. The first terminal 9a and the second terminal 9b are connected to the signal processing circuit 8. Although not shown in FIG. 13(a), the signal processing circuit 8 is connected to a transmit-receive switch via a coaxial cable, and the transmit-receive switch is connected to the high frequency magnetic field generator 106 and the receiver 108.

As in the first embodiment, the circuit 19 shown in FIG. 4 is an equivalent circuit of the circular polarized RF coil 253 according to this embodiment. However, in the circular polarized RF coil 253 according to this embodiment, the first loop part 5 and the second loop part 6 have the shape of a saddle-type coil and are disposed to share one center axis 29, and the dimensions and the arrangement of the first loop part 5 and the second loop part 6 are adjusted to prevent magnetic coupling between the first loop part and the second loop part. Furthermore, the first loop part 5 and the second loop part 6 are disposed to reduce the length of the joint part 7c so that the equivalent inductance of the joint part 7c is equal to or less than a hundredth of the inductance of the first loop part and the second loop part.

If the first loop part 5 and the second loop part 6 are disposed as described above, as shown in FIG. 13(b), the direction 21 of the high frequency magnetic field detected and generated by the first loop part 5 and the direction 22 of the high frequency magnetic field detected and generated by the second loop part 6 are perpendicular to each other.

The circular polarized RF coil 253 is disposed in such a manner that at least part of an examinee 10 having a body axis 11 substantially parallel to the direction of the static magnetic field 100 is disposed inside the first loop part 5 and the second loop part 6, and the center axis 29 of the circular polarized RF coil 253 is substantially parallel to the direction of the static magnetic field 100. In addition, the second capacitor 2, the fourth capacitor 4 and the joint parts 7a, 7b and 7c are connected so that the circular polarized RF coil 253 generates or detects a circular polarized magnetic field rotating clockwise viewed in the opposite direction of the static magnetic field 100 in the examinee 10. In FIG. 13, the inductance of the first loop part 5 and the second loop part 6 is not shown.

The inductance ($L_1$) of the inductor and the values ($C_1, C_2,$) of the first capacitor 1 and the second capacitor 2 of the first loop part 5 and the inductance ($L_2$) of the inductor and the values ($C_3, C_4,$) of the third capacitor 3 and the fourth capacitor 4 of the second loop part 6 thus configured according to this embodiment are adjusted so that the circular polarized RF coil 253 detects and generates a circular polarized magnetic field rotating clockwise viewed in the opposite direction of the static magnetic field 100 in the examinee 10 and resonates at a magnetic resonance frequency of a predetermined element. In the following, as with the first embodiment, in this embodiment also, a case where a magnetic resonance signal of a proton is transmitted and received will be described, as an example. That is, there will be described in detail a case where the high frequency magnetic field generator 106 applies a high frequency voltage having a central frequency at a magnetic resonance frequency $f_H$ ($f_H$=64 MHz) of a proton at a magnetic field intensity of 1.5 T to the circular polarized RF coil 253 in this embodiment, and the circular polarized RF coil 253 applies a high frequency magnetic field at a resonance frequency $f_H$ to the examinee 10 with high efficiency as a transmission coil and detects a magnetic resonance signal of a proton at a magnetic resonance frequency $f_H$ from the examinee 10 as a receiving coil.

In the case where a high frequency voltage having the center frequency at the frequency $f_H$ transmitted from the high frequency magnetic field generator 106 is applied to the circular polarized RF coil 253, the equivalent circuit of the circular polarized RF coil 253 in this embodiment shown in FIG. 13 viewed from the first terminal 9a and the second terminal 9b is the equivalent circuit 19 shown in FIG. 4, as in the first embodiment. That is, the equivalent circuit is a series connection of a first serial-parallel resonant circuit 27, in which a first serial resonant circuit 23 composed of an equivalent inductor 15 of the first loop part 5, a first capacitor and a resistive component 31 of the first loop part connected in series to each other and a second capacitor 2 are connected in parallel to each other, and a second serial-parallel resonant circuit 28, in which a second serial resonant circuit 24 composed of an equivalent inductor 16 of the second loop part 6, a third capacitor 3 and a resistive component 32 of the second loop part connected in series to each other and a fourth capacitor 4 are connected in parallel to each other.

Therefore, the circular polarized RF coil 253 in this embodiment resonates at the resonance frequency $f_H$ if the values $C_1, C_2, C_3$ and $C_4$ of the first capacitor 1, the second capacitor 2, the third capacitor 3 and the fourth capacitor 4 are adjusted so that the formulas 1 and 2 and the formulas 8 to 13 are all satisfied.

If the examinee 10 and the circular polarized RF coil 253 are disposed as shown in FIG. 13, and a high frequency voltage at the resonance frequency $f_H$ is applied to the circular polarized RF coil 253, as shown in FIG. 13(b), the first loop part 5 generates a first linearly polarized magnetic field in the direction 21 of the first high frequency magnetic field, and the second loop part 6 generates a second linearly polarized magnetic field in the direction 22 of the second high frequency magnetic field, and the difference between the phase of the first linearly polarized magnetic field and the phase of the second linearly polarized magnetic field is 90 degrees. Therefore, as shown in FIG. 14(a), the high frequency magnetic field generated by the circular polarized RF coil 253 in this embodiment is a composition of the vector 17 ($B_1$) of the first linearly polarized magnetic field parallel to the direction 21 of the first high frequency magnetic field and the vector 18 ($B_2$) of the second linearly polarized magnetic field parallel to the direction 22 of the second high frequency magnetic field. Supposing that the direction 21 of the first high frequency magnetic field is parallel to the x'-axis, and the direction 22 of the second high frequency magnetic field is parallel to the y'-axis, as shown in FIG. 14(b), the positional relationship between the vector 17 ($B_1$) of the first linearly polarized magnetic field and the vector 18 ($B_2$) of the second linearly polarized magnetic field is the same as the positional relationship between the linearly polarized magnetic fields shown in FIG. 8(b). Therefore, the vector 79 formed by combining the vector 17 ($B_1$) of the first linearly polarized magnetic field and the vector 18 ($B_2$) of the second linearly polarized magnetic field rotates clockwise about the origin of the x'-axis and the y'-axis while maintaining the magnitude thereof. That is, the high frequency magnetic field generated and detected by the circular polarized RF coil 253 is a circular polarized magnetic field.

As described above, the circular polarized RF coil 253 in this embodiment generates a circular polarized magnetic field rotating clockwise viewed in the opposite direction of the static magnetic field 100 in the examinee 10 and applies a high frequency magnetic field to the examinee 10 with high efficiency at the frequency $f_H$ if the values $C_1, C_2, C_3$ and $C_4$ are adjusted so that the formulas 1 and 2 and the formulas 8 to 13 are all satisfied. After application of the high frequency magnetic field, when a magnetic resonance signal at the frequency $f_H$ is emitted from the examinee 10 in the form of a circular polarized magnetic field rotating clockwise viewed in the opposite direction of the static magnetic field 100, by the reciprocity theorem, the circular polarized RF coil 253 can resonate at the frequency $f_H$ and detect the circular polarized magnetic field rotating clockwise viewed in the opposite direction of the static magnetic field 100 with high efficiency. In this way, the circular polarized RF coil 253 shown in FIG. 13 operates as transmit-receive coil for the magnetic resonance signal of a proton.

As described above, according to this embodiment, the RF coil according to this embodiment can transmit and receive a circular polarized high frequency magnetic field having high signal-to-noise ratio and high uniformity by itself, as with the QD method in which two RF coils are used to generate a circular polarized high frequency magnetic field. Therefore, compared with the QD method, the number of coils and wiring systems is reduced by one. Therefore, the distributor and the phase shifter are not necessary, and the number of components of the transmission system is reduced to half or less. Therefore, the transmission system can be more easily adjusted, and the manufacturing cost can be reduced. In addition, since there is only one input/output terminal of the coil, and the distributor and the phase shifter are not used, the degradation of the orthogonality due to the mechanical strain of the coil, and the degradation of the signal-to-noise ratio of the coil due to the phase shift in the distributor and the phase shifter can be reduced. Thus, compared with the prior art, the transmission efficiency and the reception sensitivity of the coil are improved. In addition, since the circular polarized RF coil 253 in this embodiment is disposed to surround the examinee 10, the sensitivity distribution in the depth direction of the examinee 10 is highly uniform. Therefore, compared with the circular polarized RF coils in the first and second embodiments, the uniformity of the sensitivity distribution in the examinee is improved.

In this embodiment, the circular polarized RF coil 253 is disposed in such a manner that the center axis 29 thereof is substantially parallel to the direction of the static magnetic field 100. This is an example in which the normalized sensitivity of the circular polarized RF coil 253 in this embodiment is maximized. However, the present invention is not necessarily limited thereto.

Supposing that the angle between the center axis 29 of the circular polarized RF coil 253 and the direction of the static magnetic field 100 is denoted by reference character $\phi$, the normalized sensitivity S of the circular polarized RF coil 253 is expressed as $S=|\cos(\phi)|$. Therefore, when the angle between the center axis 29 and the direction of the static magnetic field 100 is 0 degrees, the normalized sensitivity S is maximized. The normalized sensitivity is equal to or higher than 95% of the maximum value thereof when the angle $\phi$ is equal to or higher than 0 degrees and equal to or lower than 18 degrees. Therefore, the angle between the center axis 29 of the circular polarized RF coil 253 in this embodiment and the direction of the static magnetic field 100 is desirably equal to or higher than 0 degrees and equal to or lower than 18 degrees and is most desirably about 0 degrees. If the angle is about 0 degrees, the center axis 29 of the circular polarized RF coil 253 is substantially parallel to the direction of the static magnetic field 100. Here, the term "about" is used to mean the error range of the angle due to the manufacturing error of the coil.

Fourth Embodiment

Now, a fourth embodiment of the present invention will be described. This embodiment concerns an MRI apparatus of vertical magnetic field type. In the following, differences from the first embodiment will be particularly described.

Figure 15:
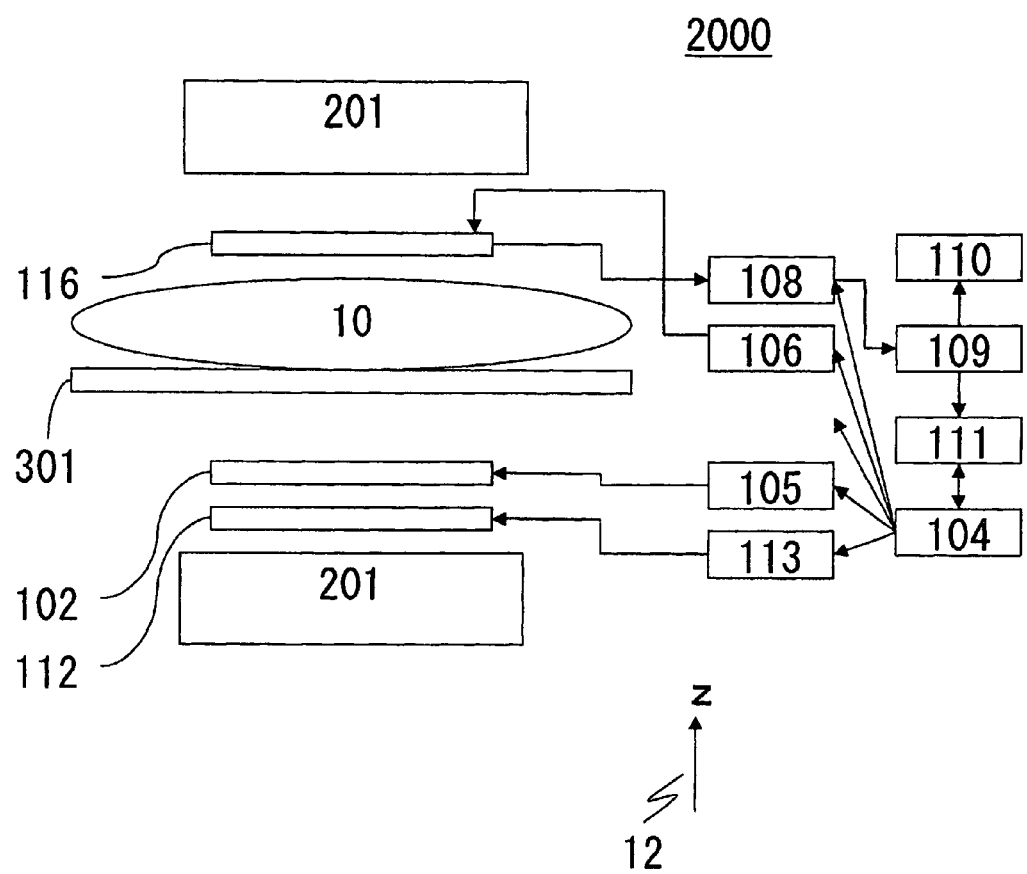
FIG. 15 is a schematic block diagram showing a configuration of an MRI apparatus according to a fourth embodiment.

FIG. 15 is a schematic block diagram showing a configuration of an MRI apparatus 2000 according to this embodiment. The same parts as those shown in FIGS. 1 and 2 are denoted by the same reference numerals. The MRI apparatus 2000 according to this embodiment comprises a magnet 201 of vertical magnetic field type, a gradient magnetic field coil 102, a shim coil 112 for adjusting the uniformity of a static magnetic field, a sequencer 104, and a transmit-receive RF coil 116 that generates a high frequency magnetic field and receives a magnetic resonance signal. The gradient magnetic field coil 102 and the shim coil 112 are connected to a gradient magnetic field power supply 105 and a shim power supply 113, respectively. The transmit-receive RF coil 116 is connected to a high frequency magnetic field generator 106 and a receiver 108. The sequencer 104 transmits a command to the gradient magnetic field power supply 105, the shim power supply 113 and the high frequency magnetic field generator 106 for generating a gradient magnetic field and a high frequency magnetic field. The high frequency magnetic field is applied to the examinee 10 via the transmit-receive RF coil 116. When the high frequency magnetic field is applied to the examinee 10, the examinee 10 emits a magnetic resonance signal, which is detected by the transmit-receive RF coil 116 and by the receiver 108. The magnetic resonance frequency used as a reference for the detection by the receiver 108 is set by the sequencer 104. The detected signal is transmitted to a computer 109 via an A/D converter, and the computer 109 carries out a signal processing, such as image reconstruction. The result of the signal processing is shown on a display 110. The detected signal and measurement conditions are stored in a storage medium 111, as required. The sequencer 104 controls the operation of each device according to a timing and an intensity previously programmed.

The MRI apparatus 2000 according to this embodiment has a circular polarized RF coil capable of transmitting and receiving a circular polarized magnetic field at one input/output terminal as the transmit-receive RF coil 116. In the following, a circular polarized RF coil used as the transmit-receive RF coil 116 in this embodiment will be described.

FIG. 16 includes diagrams for illustrating a configuration of a circular polarized RF coil 254 according to this embodiment. In this drawing, the direction of a static magnetic field 100 generated by the magnet 201 of vertical magnetic field type is the direction of the z-axis of a coordinate system 12. FIG. 16($a$) shows the circular polarized RF coil 254 viewed from a direction perpendicular to the z-axis, and FIG. 16($b$) shows the circular polarized RF coil 254 viewed in the direction of the z-axis (the opposite direction of the static magnetic field 100).

As shown in FIG. 16($a$), the circular polarized RF coil 254 according to this embodiment has a first loop part 5 and a second loop part 6 that are made of a conductor, at least one first capacitor 1 and at least one second capacitor 2 that are included in the first loop part 5, at least one third capacitor 3 and at least one fourth capacitor 4 that are included in the second loop part 6, an input/output terminal 9 composed of a first terminal 9$a$ and a second terminal 9$b$, a signal processing circuit 8, and joint parts 7$a$, 7$b$ and 7$c$. In this embodiment also, the signal processing circuit 8 is a balun (balanced-to-unbalanced transformer) circuit that removes common mode noise. The joint part 7$a$ connects the first loop part 5 to the first terminal 9$a$, and the joint part 7$b$ connects the second loop part 6 to the second terminal 9$b$. In the first loop part 5, the joint parts 7$a$ and 7$c$ are connected to the opposite ends of the second capacitor 2. In the second loop part 6, the joint parts 7$b$ and 7$c$ are connected to the opposite ends of the fourth capacitor 4. The first terminal 9$a$ and the second terminal 9$b$ are connected to the signal processing circuit 8. Although not shown in FIG. 16($a$), the signal processing circuit 8 is connected to a transmit-receive switch via a coaxial cable, and the transmit-receive switch is connected to the high frequency magnetic field generator 106 and the receiver 108.

As in the first embodiment, the circuit 19 shown in FIG. 4 is an equivalent circuit of the circular polarized RF coil 254 according to this embodiment. However, the first loop part 5 has the shape of a saddle-type coil, and the second loop part 6 has the shape of a loop coil. The first loop part 5 and the second loop part 6 are disposed so that a center 14 of the second loop part 6 lies on a center axis 29 of the first loop part 5, and the center axis 29 of the first loop part 5 is perpendicular to the plane of the second loop part 6. Furthermore, the first loop part 5 and the second loop part 6 are disposed to reduce the length of the joint part 7$c$ so that the equivalent inductance of the joint part 7c is equal to or less than a hundredth of the inductance of the first loop part and the second loop part.

The circular polarized RF coil 254 is disposed in such a manner that at least part of the examinee 10 having a body axis 11 substantially parallel to the direction of the static magnetic field 100 is disposed inside the first loop part 5 and the second loop part 6, and the center axis 29 of the circular polarized RF coil 254 is substantially perpendicular to the direction of the static magnetic field 100. In addition, as shown in FIG. 16(b), the circular polarized RF coil 254 is disposed in such a manner that the direction 21 of a first high frequency magnetic filed detected and generated by the first loop part 5 and the direction 22 of a second high frequency magnetic field detected and generated by the second loop part 6 are perpendicular to each other. In addition, the second capacitor 2, the fourth capacitor 4 and the joint parts 7a, 7b and 7c are connected so that the circular polarized RF coil 254 generates or detects a circular polarized magnetic field rotating clockwise viewed in the opposite direction of the static magnetic field 100 in the examinee 10. In FIG. 16, the inductance of the first loop part 5 and the second loop part 6 is not shown.

The inductance ($L_1$) of the inductor and the values ($C_1, C_2$,) of the first capacitor 1 and the second capacitor 2 of the first loop part 5 and the inductance ($L_2$) of the inductor and the values ($C_3, C_4$,) of the third capacitor 3 and the fourth capacitor 4 of the second loop part 6 thus configured according to this embodiment are adjusted so that the circular polarized RF coil 254 detects and generates a circular polarized magnetic field rotating clockwise viewed in the opposite direction of the static magnetic field 100 in an interior 26 of the examinee 10 and resonates at a magnetic resonance frequency of a predetermined element. In the following, as an example, a case where a magnetic resonance signal of a proton is transmitted and received will be described. That is, there will be described in detail a case where the high frequency magnetic field generator 106 applies a high frequency voltage having a central frequency at a magnetic resonance frequency $f_H$ ($f_H$=64 MHz) of a proton at a magnetic field intensity of 1.5 T to the circular polarized RF coil 254 in this embodiment, the circular polarized RF coil 254 applies a high frequency magnetic field at a resonance frequency $f_H$ to the examinee 10 with high efficiency as a transmission coil and detects a magnetic resonance signal of a proton at a magnetic resonance frequency $f_H$ from the examinee 10 as a receiving coil.

In the case where a high frequency voltage having the center frequency at the frequency $f_H$ transmitted from the high frequency magnetic field generator 106 is applied to the circular polarized RF coil 254, the equivalent circuit of the circular polarized RF coil 254 in this embodiment shown in FIG. 16 viewed from the first terminal 9a and the second terminal 9b is the equivalent circuit 19 shown in FIG. 4, as in the first embodiment. That is, the equivalent circuit is a series connection of a first serial-parallel resonant circuit 27, in which a first serial resonant circuit 23 composed of an equivalent inductor 15 of the first loop part 5, a first capacitor and a resistive component 31 of the first loop part connected in series to each other and a second capacitor 2 are connected in parallel to each other, and a second serial-parallel resonant circuit 28, in which a second serial resonant circuit 24 composed of an equivalent inductor 16 of the second loop part 6, a third capacitor 3 and a resistive component 32 of the second loop part connected in series to each other and a fourth capacitor 4 are connected in parallel to each other.

Therefore, the circular polarized RF coil 254 in this embodiment resonates at the resonance frequency $f_H$ if the values $C_1, C_2, C_3$ and $C_4$ of the first capacitor 1, the second capacitor 2, the third capacitor 3 and the fourth capacitor 4 are adjusted so that the formulas 1 and 2 and the formulas 8 to 13 are all satisfied.

If the examinee 10 and the circular polarized RF coil 254 are disposed as shown in FIG. 16, and a high frequency voltage at the resonance frequency $f_H$ is applied to the circular polarized RF coil 254, as shown in FIG. 16(b), the first loop part 5 generates a first linearly polarized magnetic field in the direction 21 of the first high frequency magnetic field, and the second loop part 6 generates a second linearly polarized magnetic field in the direction 22 of the second high frequency magnetic field, and the difference between the phase of the first linearly polarized magnetic field and the phase of the second linearly polarized magnetic field is 90 degrees. Therefore, as shown in FIG. 17(a), the high frequency magnetic field generated by the circular polarized RF coil 254 in this embodiment is a composition of the vector 17 ($B_1$) of the first linearly polarized magnetic field parallel to the direction 21 of the first high frequency magnetic field and the vector 18 ($B_2$) of the second linearly polarized magnetic field parallel to the direction 22 of the second high frequency magnetic field. Supposing that the direction 21 of the first high frequency magnetic field is parallel to the x'-axis, and the direction 22 of the second high frequency magnetic field is parallel to the y'-axis, as shown in FIG. 17(b), the positional relationship between the vector 17 ($B_1$) of the first linearly polarized magnetic field and the vector 18 ($B_2$) of the second linearly polarized magnetic field is the same as the positional relationship between the linearly polarized magnetic fields shown in FIG. 8(b). Therefore, the vector 79 formed by combining the vector 17 ($B_1$) of the first linearly polarized magnetic field and the vector 18 ($B_2$) of the second linearly polarized magnetic field rotates clockwise about the origin of the x'-axis and the y'-axis while maintaining the magnitude thereof. That is, the high frequency magnetic field generated and detected by the circular polarized RF coil 254 is a circular polarized magnetic field.

As described above, the circular polarized RF coil 254 in this embodiment generates a circular polarized magnetic field rotating clockwise viewed in the opposite direction of the static magnetic field 100 in the examinee 10 and applies a high frequency magnetic field to the examinee 10 with high efficiency at the frequency $f_H$ if the values $C_1, C_2, C_3$ and $C_4$ are adjusted so that the formulas 1 and 2 and the formulas 8 to 13 are all satisfied. After application of the high frequency magnetic field, when a magnetic resonance signal at the frequency $f_H$ is emitted from the examinee 10 in the form of a circular polarized magnetic field rotating clockwise viewed in the opposite direction of the static magnetic field 100, by the reciprocity theorem, the circular polarized RF coil 254 can resonate at the frequency $f_H$ and detect the circular polarized magnetic field rotating clockwise viewed in the opposite direction of the static magnetic field 100 with high efficiency. In this way, the circular polarized RF coil 254 shown in FIG. 16 operates as transmit-receive coil for the magnetic resonance signal of a proton.

As described above, the RF coil according to this embodiment can transmit and receive a circular polarized high frequency magnetic field having high signal-to-noise ratio and high uniformity by itself, as with the QD method in which two RF coils are used to generate a circular polarized magnetic field. Therefore, compared with the QD method, the number of coils and wiring systems is reduced by one. Therefore, the distributor and the phase shifter are not necessary, and the number of components of the transmission system is reduced to half or less. Therefore, the transmission system can be more easily adjusted, and the manufacturing cost can be reduced. In addition, since there is only one input/output terminal of the coil, and the distributor and the phase shifter are not used, the degradation of the orthogonality due to the mechanical strain of the coil, and the degradation of the signal-to-noise ratio of the coil due to the phase shift in the distributor and the phase shifter can be reduced. Thus, compared with the prior art, the transmission efficiency and the reception sensitivity of the coil are improved. In addition, since the circular polarized RF coil 254 in this embodiment is disposed to surround the examinee 10, the uniformity of the sensitivity distribution in the depth direction of the examinee 10 is improved. Therefore, compared with the circular polarized RF coils 25 and 252 in the first and second embodiments, the uniformity of the sensitivity distribution in the arms, the head, the lower legs and the knees of the examinee is improved.

In this embodiment, the first loop part 5 is disposed in such a manner that the center axis 29 thereof is substantially parallel to the direction of the static magnetic field 100. This is an example in which the normalized sensitivity of the circular polarized RF coil 254 in this embodiment is maximized. However, the placement of the first loop part 5 is not necessarily limited thereto.

Supposing that the angle between the center axis 29 of the first loop part 5 and the direction of the static magnetic field 100 is denoted by reference character $\phi$, the normalized sensitivity S of the circular polarized RF coil 254 is expressed as $S=|\sin(\phi)|$. Therefore, when the angle between the center axis 29 and the direction of the static magnetic field 100 is 90 degrees, the normalized sensitivity S is maximized. The normalized sensitivity is equal to or higher than 95% of the maximum value thereof when the angle $\phi$ is equal to or higher than 72 degrees and equal to or lower than 108 degrees. Therefore, the angle between the center axis 29 of the first loop part 5 of the circular polarized RF coil 254 in this embodiment and the direction of the static magnetic field 100 is desirably equal to or higher than 72 degrees and equal to or lower than 108 degrees and is most desirably about 90 degrees. Here, the term "about" is used to mean the error range of the angle due to the manufacturing error of the coil.

Fifth Embodiment

Now, a fifth embodiment of the present invention will be described. This embodiment is essentially the same as the first embodiment. However, this embodiment differs from the first embodiment in that an MRI apparatus according to this embodiment separately has a transmit RF coil and a receive RF coil. As in the first embodiment, the MRI apparatus can be of the horizontal magnetic field type or the vertical magnetic field type. In the following, as an example, the horizontal magnetic field type will be described focusing on differences from the first embodiment.

Figure 18:
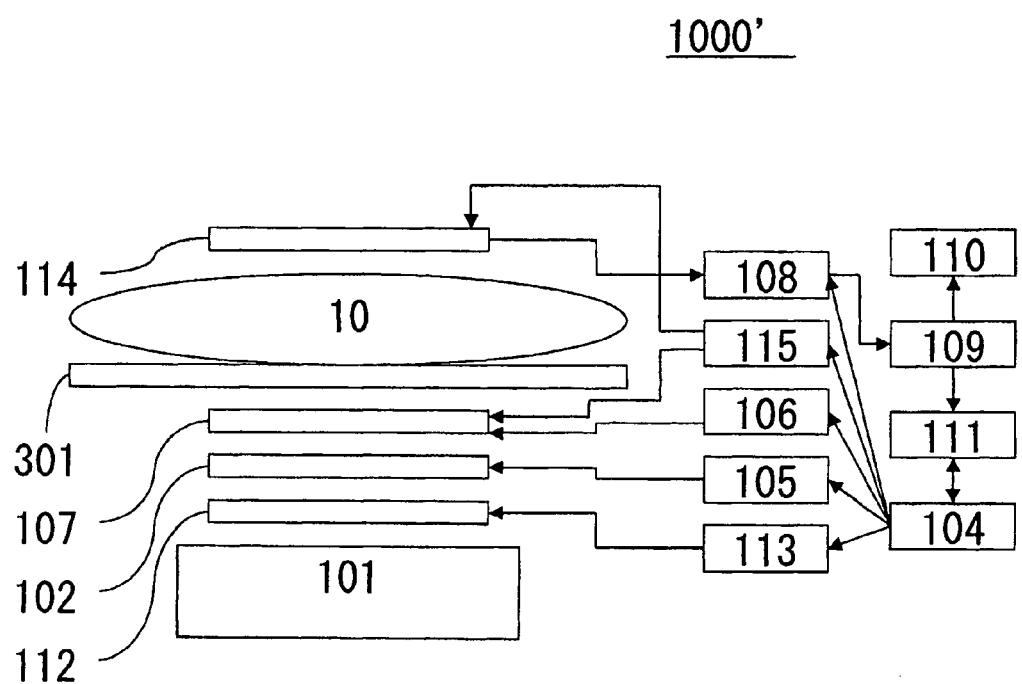
FIG. 18 is a schematic block diagram showing a configuration of an MRI apparatus according to a fifth embodiment.

FIG. 18 is a schematic block diagram showing a configuration of an MRI apparatus 1000' according to this embodiment. The MRI apparatus 1000' according to this embodiment comprises a magnet 101 of horizontal magnetic field type, a gradient magnetic field coil 102, a shim coil 112 for adjusting the uniformity of a static magnetic field, a sequencer 104, a transmit RF coil 107 that generates a high frequency magnetic field, and a receive RF coil 114 that receives an RF signal generated by an examinee 10. The gradient magnetic field coil 102 and the shim coil 112 are connected to a gradient magnetic field power supply 105 and a shim power supply 113, respectively. The transmit RF coil 107 is connected to a high frequency magnetic field generator 106, and the receive RF coil 114 is connected to a receiver 108.

The transmit RF coil 107 and the receive RF coil 114 are connected to a magnetic coupling preventing circuit driver 115, and the operational state (active/inactive) of the coils is switched by a magnetic coupling preventing signal from the magnetic coupling preventing circuit driver 115. When the transmit RF coil 107 is used to apply a high frequency magnetic field to the examinee 10, the magnetic coupling preventing circuit driver 115 transmits a magnetic coupling preventing signal to the receive RF coil 114 in response to a command from the sequencer 104, thereby making the receive RF coil 114 open and inactive, thereby preventing the magnetic coupling of the receive RF coil 114 with the transmit RF coil 107. When the receive RF coil 114 is used to receive an RF signal generated from the examinee 10, the magnetic coupling preventing circuit driver 115 transmits a magnetic coupling preventing signal to the transmit RF coil 107 in response to a command from the sequencer 104, thereby making the transmit RF coil 107 open and inactive, thereby preventing the magnetic coupling of the transmit RF coil 107 with the receive RF coil 114. The remainder of the configuration and the operation of the MRI apparatus is the same as the MRI apparatus according to the first embodiment.

Now, the transmit RF coil 107 and the receive RF coil 114 according to this embodiment will be described.

In this embodiment, as an example, there will be described a case where a coil 52 having the shape of a birdcage (birdcage type coil) is used as the transmit RF coil 107. FIG. 19 includes diagrams for illustrating a configuration of the birdcage type coil 52 that serves as the transmit RF coil 107 in this embodiment. In this embodiment, the direction of a static magnetic field 100 generated by the magnet 101 of horizontal magnetic field type is the direction of the z-axis of a coordinate system 12. FIG. 19(a) shows the transmit RF coil 107 in this embodiment viewed in a direction perpendicular to the z-axis, and FIG. 19(b) is a diagram for illustrating in detail a magnetic coupling preventing circuit 47 used with the transmit RF coil 107 in this embodiment.

As shown in FIG. 19(a), the transmit RF coil 107 in this embodiment (the birdcage type coil 52) has two loop conductors 38 and 39 having a common center axis perpendicular to the loop planes thereof disposed to face each other and a plurality of linear conductors 30 extending in parallel to the axis of the loop conductors 38 and 39 and connecting the two loop conductors to each other (eight linear conductors 30 are shown in FIG. 19(b), as an example). The loop conductors 38 and 39 include a plurality of magnetic coupling preventing circuits 47 and a plurality of capacitors 40 inserted therein, respectively.

As shown in FIG. 19(b), the magnetic coupling preventing circuit 47 comprises a circuit including an inductor 43 and a PIN diode 61 connected in series to each other and a capacitor 44 connected in parallel to the circuit. The PIN diode 61 generally becomes conductive when the value of the direct current flowing through the diode in the forward direction becomes equal to or higher than a predetermined value, and the on/off switching of the PIN diode 61 is controlled by the direct current. Output terminals of the magnetic coupling preventing circuit driver 115 are connected to the opposite ends of the PIN diode 61. The PIN diode 61 in the magnetic coupling preventing circuit 47 is turned on and off by a control current 66 from the magnetic coupling preventing circuit driver 115, thereby making the birdcage type coil 52 serve as the transmit RF coil when to radiate (transmit) a high frequency magnetic field and increasing the impedance of the birdcage type coil 52 to prevent interference with the receive RF coil when to receive a high frequency signal. This operation will be described in detail later.

The capacitor 40 in the birdcage type coil 52 and the capacitor 44 in the magnetic coupling preventing circuit 47 have an equal value and are adjusted so that the birdcage type coil 52 resonates at a predetermined frequency $f_c$. The value of the inductor 43 is adjusted so that the magnetic coupling preventing circuit 47 resonates at the predetermined frequency $f_c$ when the PIN diode 61 is in the on state.

In this embodiment, as an example, there will be described a case where a circular polarized RF coil (a receive circular polarized RF coil) 53 is used as the receive RF coil 114. FIG. 20 includes diagrams for illustrating a configuration of the receive circular polarized RF coil 53 that serves as the receive RF coil 114 in this embodiment. In this embodiment, the direction of the static magnetic field 100 generated by the magnet 101 of horizontal magnetic field type is the direction of the z-axis of the coordinate system 12. FIG. 20(a) shows the receive circular polarized RF coil 53 viewed in a direction perpendicular to the z-axis, and FIGS. 20(b) and 20(c) are diagrams for illustrating two magnetic coupling preventing circuits provided for the receive circular polarized RF coil 53.

The receive circular polarized RF coil 53 in this embodiment essentially has the same shape and configuration as the circular polarized RF coil 252 according to the second embodiment. However, the first capacitor 1 and the third capacitor 3 are replaced with a first magnetic coupling preventing circuit 48 and a second magnetic coupling preventing circuit 49 shown in FIGS. 20(b) and 20(c), respectively, and a preamplifier for amplifying signals is used as the signal processing circuit 8, instead of the balun circuit. The first magnetic coupling preventing circuit 48 and the second magnetic coupling preventing circuit 49 have the same configuration as the magnetic coupling preventing circuit 47 in the birdcage type coil 52 shown in FIG. 19. The on/off switching of PIN diodes 61a and 61b in the first magnetic coupling preventing circuit 48 and the second magnetic coupling preventing circuit 49 is controlled by the control current 66 from the magnetic coupling preventing circuit driver 115. To receive a high frequency signal, the receive circular polarized RF coil 53 is made to function as the receive RF coil, and to transmit a high frequency magnetic field, the impedance of the receive circular polarized RF coil 53 is increased to prevent interference with the transmit RF coil 107. This operation will be described in detail later.

In order that the receive circular polarized RF coil 53 resonates at the predetermined frequency $f_c$, capacitors 71 and 73 are adjusted to the same value as the first capacitor 1 and the third capacitor 3 of the circular polarized RF coil 252 in the second embodiment, respectively. The values of inductors 51 and 63 are adjusted so that the first magnetic coupling preventing circuit 48 and the second magnetic coupling preventing circuit 49 resonate at the predetermined frequency $f_c$ when the PIN diodes 61a and 61b are in the on state. In the following, as an example, there will be described a case where the frequency $f_c$ is equal to the magnetic resonance frequency $f_H$ ($f_H$=64 MHz) of a proton at a magnetic intensity of 1.5 T.

The receive RF coil 114 is not limited to the configuration described above. For example, the receive RF coil 114 can also be configured as shown in FIG. 21(a). A receive circular polarized RF coil 54 shown in this drawing comprises an array of receive circular polarized RF coils 53 shown in FIG. 20, in which the first loop parts 5 of adjacent coils are connected by a neutralizing circuit 37 to each other. The neutralizing circuit 37 is composed of capacitors 41 inserted in the adjacent first loop parts 5 and a bridge circuit having capacitors 45 and a trimmer capacitor 42. As shown in FIG. 21(b) the value of the capacitor 41 is adjusted to the value of the first capacitor 1 of the circular polarized RF coil 252 in the second embodiment so that the receive circular polarized RF coil 54 resonate at the predetermined frequency $f_H$. The values of the capacitor 45 and the trimmer capacitor 42 are adjusted so that interference between the adjacent coils is avoided. The neutralizing circuit 37 is not limited to the bridge circuit having capacitors described above. Any circuit is possible as far as avoid the interference between the adjacent coils.

The receive RF coil 114 is not limited to the shape described above. Any shape is possible as far as receive RF coils 114 can be configured in an array. For example, the receive RF coil 114 can also have the shape of the circular polarized RF coil 25 having two loop coils in the first embodiment.

Now, a positional relationship between the transmit RF coil 107 and the receive RF coil 114 described above, and connections between the transmit RF coil 107 and the high frequency magnetic field generator 106 and between the receive RF coil 114 and the receiver 108 will be described. In this embodiment, as an example, there will be described a case where the birdcage type coil 52 is used as the transmit RF coil 107, and the receive circular polarized RF coil 53 is used as the receive RF coil 114.

Figure 22:
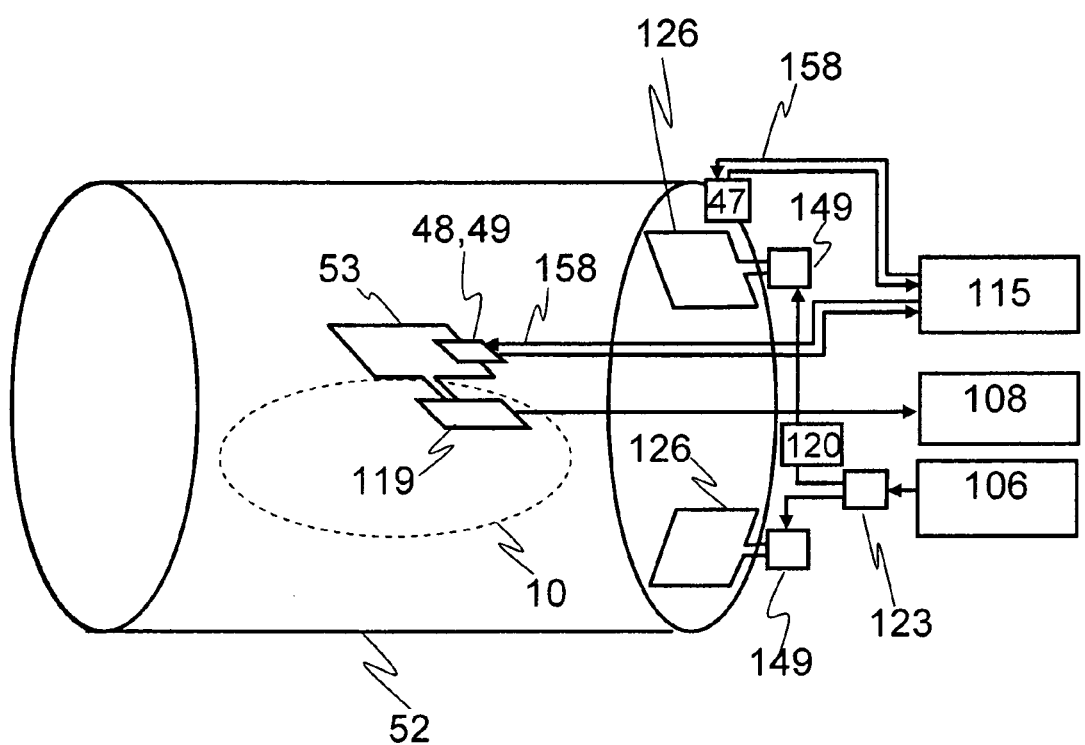
FIG. 22 is a diagram showing a positional relationship between the transmit RF coil and the receive RF coil and a connection between a transmitter and a receiver according to the fifth embodiment.

FIG. 22 is a diagram for illustrating a positional relationship and connections between the coils described above. As shown in this drawing, the output of the high frequency magnetic field generator 106 that generates a high frequency magnetic field at a resonance frequency $f_H$ is connected to and divided into two by a divider 123, and the resulting two outputs are connected to pickup coils 126 via baluns 149. In one of these paths, a phase shifter is inserted. The pickup coils 126 are disposed to transmit a high frequency signal at the resonance frequency $f_H$ to the birdcage type coil 52. The magnetic coupling preventing circuit driver 115 is connected to a plurality of magnetic coupling preventing circuits 47 in the transmit birdcage type coil 52 by a plurality of control signal lines 158.

The receive circular polarized RF coil 53 is disposed close to the examinee 10 in the birdcage type coil 52. The output terminal of the receive circular polarized RF coil 53 is connected to the receiver 108 via a balun 119. The magnetic coupling preventing circuit driver 115 is connected to the magnetic coupling preventing circuits 47 in the transmit birdcage type coil 52 and the first magnetic coupling preventing circuit 48 and the second magnetic coupling preventing circuit 49 in the receive circular polarized RF coil 53 by a plurality of control signal lines 158.

Now, with reference to FIGS. 19, 20 and 22, operations of the birdcage type coil 52 and the receive circular polarized RF coil 53 will be described.

Immediately before the high frequency magnetic field generator 106 applies the high frequency magnetic field at the resonance frequency $f_H$ to the birdcage type coil 52, the magnetic coupling preventing circuit driver 115 sets the value of the control current 66 to flow through the PIN diode 61 in the birdcage type coil 52 at 0 and applies a direct control current 66 to the receive circular polarized RF coil 53 to turn on the PIN diodes 61a and 61b therein.

Since the value of the control current flowing through the diodes 61 is 0 in the birdcage type coil 52, all the diodes 61 are turned off, and the birdcage type coil 52 resonates at the frequency $f_H$. On the other hand, since the control current 66 applied to the receive circular polarized RF coil 53 turns on the PIN diodes 61a and 61b, the first magnetic coupling preventing circuit 48 and the second magnetic coupling preventing circuit 49 resonate at the frequency $f_H$. At this time, the first magnetic coupling preventing circuit 48 and the second magnetic coupling preventing circuit 49 each constitute a parallel resonant circuit, and the first loop part 5 and the second loop part 6 of the receive circular polarized RF coil 53 are substantially open. As a result, no current flows through the first loop part and the second loop part of the receive circular polarized RF coil 53, and the receive circular polarized RF coil 53 does not generate magnetic field.

Therefore, magnetic coupling does not occur between the birdcage type coil 52 and the receive circular polarized RF coil 53, and the birdcage type coil 52 can radiate a high frequency magnetic field at the resonant frequency $f_H$ to the examinee 10 without a shift of the resonant frequency or a reduction of the Q value of the coil due to the magnetic coupling.

The high frequency signals at the resonance frequency $f_H$ applied from the high frequency magnetic field generator 106 are divided into two by the divider 123, and one of the two groups of signals is phase-shifted by 90 degrees by a 90-degree phase shifter 120. The two groups of signals are applied to the two pickup coils 126 via the baluns 149, respectively. The signals are transmitted from the two pickup coils 126 to the birdcage type coil 52, and the examinee 10 is irradiated with a circular polarized magnetic field.

After the irradiation of the circular polarized magnetic field, in order to receive a magnetic resonance signal generated from the examinee 10, the magnetic coupling preventing circuit driver 115 applies the control current 66 to the birdcage type coil 52 to turn on the diode 61 therein and sets the control current 66 to flow through the diodes 61a and 61b in the receive circular polarized RF coil 53 at 0.

The control current 66 applied to the birdcage type coil 52 turns on the diode 61, and the magnetic coupling preventing circuit 47 resonates at the frequency $f_H$. At this time, since the magnetic coupling preventing circuit 47 is a parallel resonant circuit, the loop conductor 38 of the birdcage type coil 52 is substantially open. As a result, no current flows through the conductor of the birdcage type coil 52, and the birdcage type coil 52 does not generate magnetic field. On the other hand, since the value of the control current 66 flowing through the diodes 61a and 61b in the receive circular polarized RF coil 53 is 0, the diodes 61a and 61b are turned off, and the first magnetic coupling preventing circuit 48 and the second magnetic coupling preventing circuit 49 operate as the capacitors 71 and 73, respectively. As a result, the receive circular polarized RF coil 53 resonates at the frequency $f_H$ and operates as a coil that detects a circular polarized magnetic field with high efficiency.

Therefore, when the receive circular polarized RF coil 53 receives the magnetic resonance signal at the resonance frequency $f_H$ generated by the inspection target, magnetic coupling does not occur between the receive circular polarized RF coil 53 and the transmit birdcage type coil 52, and the receive circular polarized RF coil 53 can receive the magnetic resonance signal at the resonance frequency $f_H$ with high sensitivity without a shift of the resonance frequency or a reduction of the Q value of the coil due to the magnetic coupling. The signal received by the receive circular polarized RF coil 53 is transmitted to the receiver 108 through the balun 119, where the signal is processed to be converted into a magnetic resonance image.

As described above, magnetic coupling between the transmit coil 107 and the receive coil 114 tuned to the magnetic resonance frequency is prevented by increasing the impedance of the receive circular polarized RF coil 53 when the high frequency magnetic field is applied and increasing the impedance of the birdcage type coil 52 when the magnetic resonance signal is received. As a result, without regard to the shape of the coils, the transmit coil 107 can apply a uniform high frequency magnetic field at the resonance frequency $f_H$, and the receive coil 114 can receive a magnetic resonance signal at the frequency $f_H$ with high sensitivity.

Therefore, the shape of the transmit coil 107 and the shape of the receive coil 114 can be independently selected. While a birdcage type coil, which has a highly uniform radiation distribution, is used as the transmit coil 107, the shape of the receive coil 114 can be selected depending on the shape or size of the examinee 10. Therefore, according to this embodiment, the magnetic resonance image of each individual examinee 10 can be taken in the optimum manner. For example, if the receive circular polarized coil 54 shown in FIG. 21, which is a phased array coil, is used as the receive coil 114, the imaging area can be expanded compared with the case of using one receive circular polarized coil 52, and the magnetic resonance signals from the whole of the trunk of the examinee (patient) 10 can be received with high sensitivity.

In general, as the number of cables connected to one coil increases, the effect of the electromagnetic interference between the cables becomes significant, and the apparent signal-to-noise ratio of the coil decreases. In this embodiment, compared with the coil of the conventional QD method, the number of cables connected to one coil is reduced to half, and therefore, the reduction of the apparent signal-to-noise ratio can be suppressed compared with the case of the coil of the conventional QD method. In the case where the receive circular polarized array coil 54 composed of a plurality of receive circular polarized RF coils 53 is used, this is particularly advantageous. For example, in the case where the receive circular polarized array coil 54 is composed of eight receive circular polarized RF coils 53, the receive circular polarized coil 54 requires only 8 cables, whereas the conventional QD method requires 16 cables to be connected to the coil. Therefore, if the receive circular polarized array coil 54, which is a phased array coil composed of receive circular polarized RF coils 53, is used, a larger number of coils can be used within the allowable range of the signal-to-noise ratio.

In this embodiment described above, as an example, the birdcage type coil 52 is used as the transmit RF coil 107, and the receive circular polarized RF coil 53, which is a combination of a loop coil and a figure-of-eight coil, is used as the receive RF coil 114. However, the transmit RF coil 107 and the receive RF coil 114 can also be those represented by the equivalent circuit of the circular polarized RF coil 25 of the MRI apparatus according to the first embodiment described above in which the first capacitor 1 and the third capacitor 3 are replaced with the first magnetic coupling preventing circuit 48 and the second magnetic coupling preventing circuit 49, respectively.

Furthermore, instead of the first magnetic coupling preventing circuit 48 and the second magnetic coupling preventing circuit 49 of the receive circular polarized RF coil 53, magnetic coupling preventing circuits shown in FIG. 23 can be used. These magnetic coupling preventing circuits use a cross diode 62 instead of the PIN diode 61 shown in FIGS. 20(b) and 20(c). The cross diode 62 is turned on by application of a high frequency magnetic field. Therefore, the control current 66 to prevent magnetic coupling with the transmit coil 107 is not necessary, and the magnetic coupling preventing circuit of the receive circular polarized RF coil 53 can be more simply configured.

In this embodiment described above, as an example, there has been described a case where the transmit RF coil 107 and the receive RF coil 114 are separately provided, and only one of the transmit RF coil 107 and the receive RF coil 114 is the circular polarized RF coil according to the present invention. However, the circular polarized RF coil according to the present invention can also be used for both the transmit RF coil 107 and the receive RF coil 114.

Figure 24:
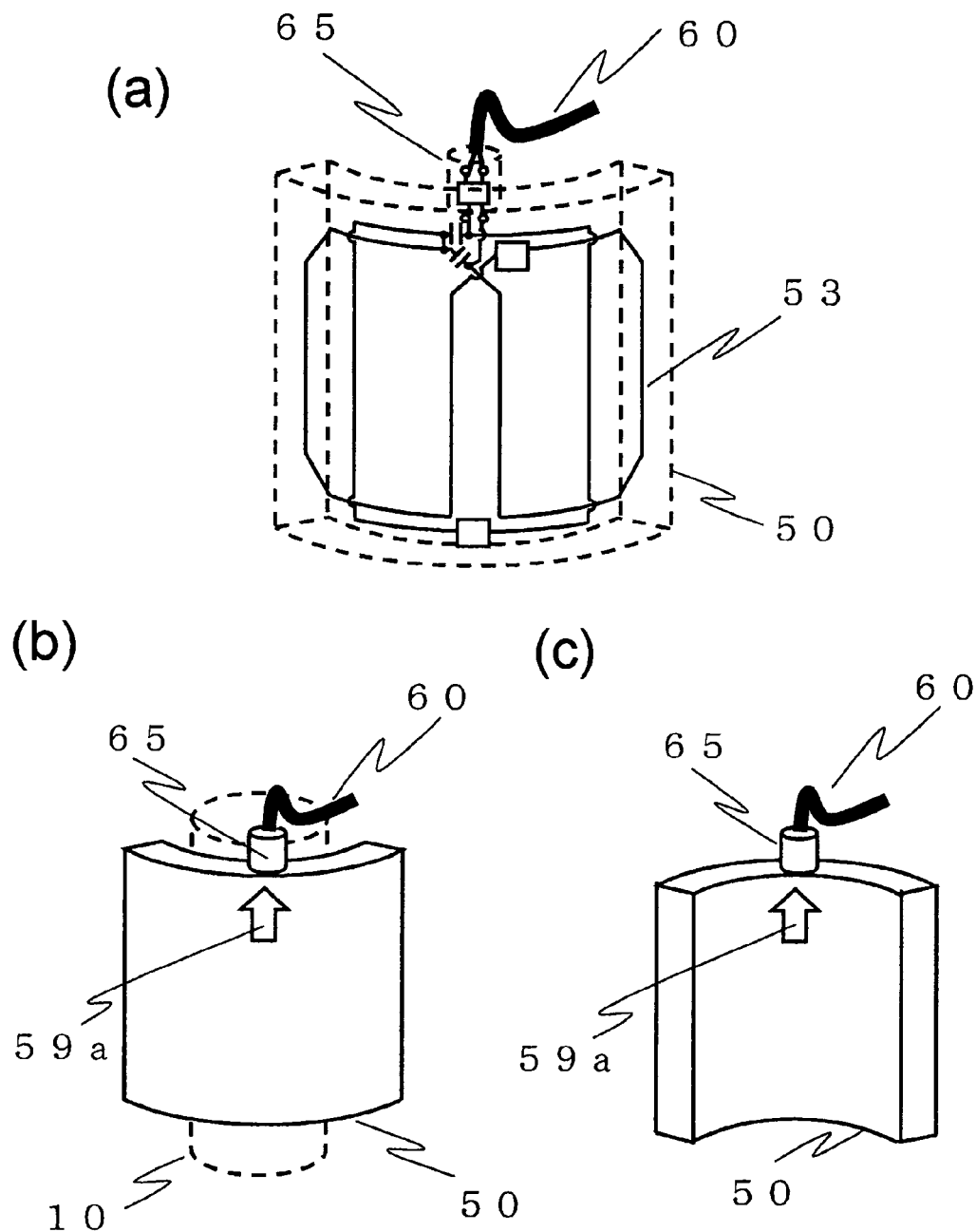
FIG. 24 includes diagrams showing an example of mounting of a circular polarized RF coil according to the fifth embodiment.

Now, mounting of the circular polarized RF coil 53 will be described. FIG. 24 shows an example of mounting of the circular polarized RF coil 53. As shown in FIG. 24(a), the circular polarized RF coil 53 is fixed in a coil cover 50 so that the shape thereof is maintained. The input/output terminal 9 of the circular polarized RF coil 53 is connected to a cable 60 via the signal processing circuit 8 and a connector 65. To help understanding of the positional relationship between the circular polarized RF coil 53 and the coil cover 50, FIG. 24(a) shows the coil cover 50 in phantom. FIGS. 24(b) and 24(c) show the appearance of the coil cover 50. The coil cover 50 has a concave surface on the side on which the coil cover 50 comes into contact with the examinee 10.

In order that the circular polarized RF coil 53 can detect a circular polarized magnetic field rotating clockwise viewed in the opposite direction of the static magnetic field 100 with the maximum efficiency, the circular polarized RF coil 53 and the MRI apparatus are marked with an arrow. To ensure that the circular polarized RF coil 53 is disposed to generate and/or detect a circular polarized magnetic field rotating clockwise viewed in the opposite direction of the static magnetic field 100, the coil cover 50 is marked with arrows 59a pointing the direction of the connector 65 on the concave surface and the opposite surface. Furthermore, as shown in FIG. 25(a), the magnet 101 of the MRI apparatus of horizontal magnetic field type is marked with a downward arrow 59b at a position above the opening thereof. The term "downward" means the –x direction in the coordinate system 12.

As shown in FIG. 25(b), the examinee 10 is placed on a table 301 of the MRI apparatus, and the coil cover 50 is disposed above the examinee 10. In this step, the circular polarized RF coil 53 is disposed in such a manner that the direction of the arrow 59b above the opening of the magnet 101 of horizontal magnetic field type and the direction of the arrow 59a on the coil cover 50 are perpendicular to each other and face toward each other. As a result, the circular polarized RF coil 53 fixed in the coil cover 50 is disposed in such a manner that the straight line connecting the center 14 of the second loop part 6 and the intersection 20 of the two coil sections of the figure-of-eight first loop part 5 is substantially parallel to the direction of the static magnetic field 100, and the circular polarized magnetic field rotating clockwise can be detected with the maximum efficiency.

In the case where the circular polarized RF coil 53 is disposed below the examinee 10, the coil cover 50 is disposed on the table 301 of the MRI apparatus with the concave surface of the coil cover 50 facing upward, and the examinee 10 is placed on the coil cover 50. The term "upward" means the +x direction in the coordinate system 12. In this step, the circular polarized RF coil 53 is disposed in such a manner that the direction of the arrow 59b above the opening of the magnet 101 of horizontal magnetic field type and the direction of the arrow 59a on the coil cover 50 are perpendicular to each other and face toward each other. As a result, the circular polarized RF coil 53 fixed in the coil cover 50 is disposed in such a manner that the straight line connecting the center 14 of the second loop part 6 and the intersection 20 of the two coil sections of the figure-of-eight first loop part 5 is substantially parallel to the direction of the static magnetic field 100, and the circular polarized magnetic field rotating clockwise can be detected with the maximum efficiency.

As described above, the magnet 101 of horizontal magnetic field type and the coil cover 50 for the circular polarized RF coil 53 are marked with the arrows 59b and 59a, respectively, the circular polarized RF coil 53 can be positioned, with high reproducibility, at a location where the circular polarized RF coil 53 can detect the circular polarized magnetic field rotating clockwise with the maximum efficiency. Therefore, the magnetic resonance signal can be detected with high sensitivity with high reproducibility. In addition, the coil can be more easily set for imaging, the workload required for imaging is reduced, and the time required for imaging can be reduced.

In the embodiments described above, the first to fourth capacitors are fixed capacitors. However, trimmer capacitors can also be used as the first to fourth capacitors. In the following, with reference to the first embodiment, a case where trimmer capacitors are used will be described.

Figure 26:
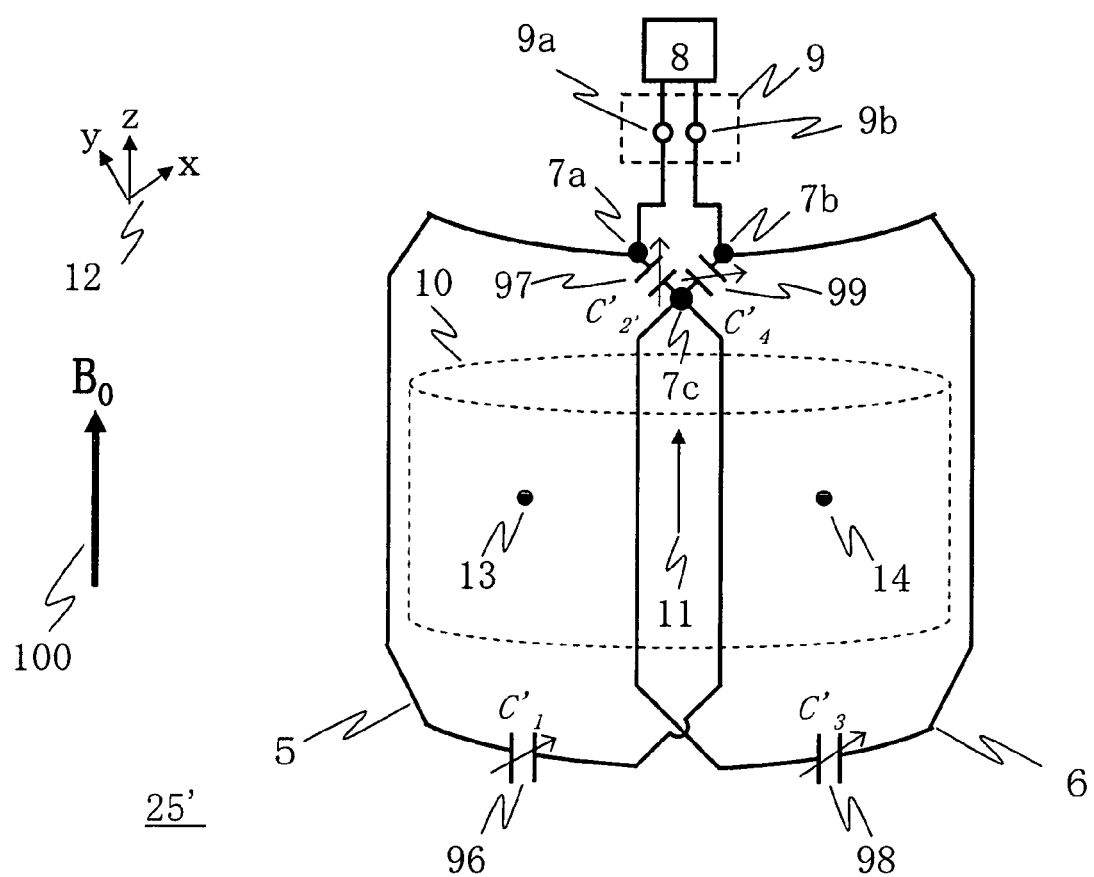
FIG. 26 is a diagram showing a variation of the circular polarized RF coil according to the first embodiment.
Figure 27:
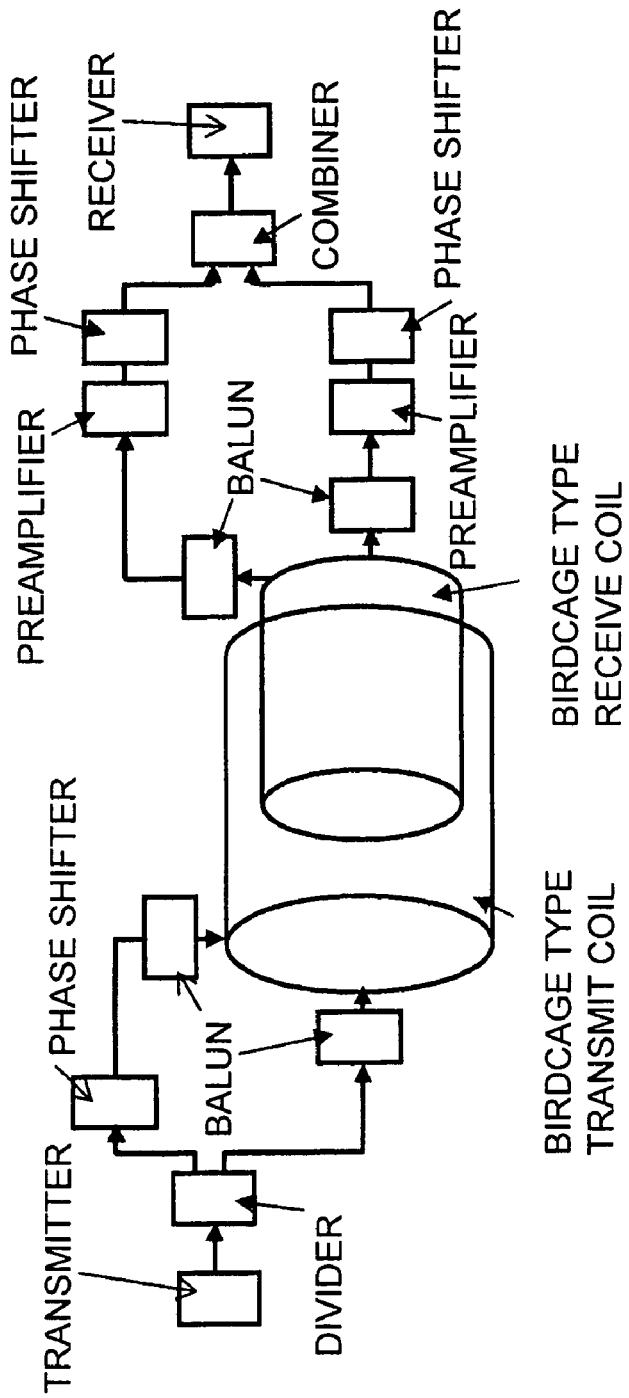
FIG. 27 is a diagram for illustrating wiring of a conventional QD coil.

FIG. 26 includes diagrams for illustrating a configuration of a circular polarized RF coil 25', which is the circular polarized RF coil 25 in the first embodiment in which the first to fourth capacitors ($C_1$, $C_2$, $C_3$, $C_4$) are replaced with trimmer capacitors ($C_1'$, $C_2'$, $C_3'$, $C_4'$). In the circular polarized RF coil 25', the first capacitor 1, the second capacitor 2, the third capacitor 3 and the fourth capacitor 4 in the circular polarized RF coil 25 are replaced with a first trimmer capacitor 96, a second trimmer capacitor 97, a third trimmer capacitor 98, and a fourth trimmer capacitor 99, respectively.

As can be seen from the formulas 8 and 9, the relationship between the value $C_1$ of the first capacitor 1 and the value $C_2$ of the second capacitor 2 and the relationship between the value $C_3$ of the third capacitor 3 and the value $C_4$ of the fourth capacitor 4 depend on the Q values ($Q_{H1}$, $Q_{H2}$) of the circular polarized RF coil 25 at the resonance frequency $f_H$. The Q value varies with the conductivity and the dielectric constant of the examinee 10. Therefore, if the Q values significantly deviate from the respective design values for an examinee 10, the Q values have to be remeasured, and the values of the capacitors have to be readjusted. Even in such a case, since the capacitors connected to the first loop part 5 and the second loop part 6 are trimmer capacitors, the values of the capacitors can be changed without replacement of the capacitors. Therefore, even if the conductivity and the dielectric constant of the examinee 10 vary significantly, the transmission efficiency and the reception sensitivity of the RF coil can be easily improved.

What is claimed is:

1. A high frequency coil configure for a magnetic resonance imaging apparatus, comprising:
    a first loop part made of a conductor including a first capacitor and a second capacitor;
    a second loop part made of a conductor including a third capacitor and a fourth capacitor;
    only one input/output terminal composed of one first terminal and one second terminal;
    a first joint part that connects said first loop part and said first terminal to each other;
    a second joint part that connects said second loop part and said second terminal to each other; and
    a third joint part that electrically connects said first loop part and said second loop part to each other,
    wherein said first joint part and said third joint part are disposed on the opposite ends of said second capacitor, and said second joint part and said third joint part are disposed on the opposite ends of said fourth capacitor, and
    said first loop part and said second loop part are disposed in order to define an area in which the direction of a high frequency magnetic field (a first high frequency magnetic field) detected or generated by said first loop part and the direction of another high frequency magnetic field (a second high frequency magnetic field) detected or generated by said second loop part are perpendicular to each other via and as the result of the only one input/output terminal.

2. The high frequency coil according to claim 1, wherein a part of said second loop part substantially lies on the same plane as said first loop part.

3. The high frequency coil according to claim 1, wherein concerning a first impedance of said first loop part viewed from said first joint part and said third joint part and a second impedance of said second loop part viewed from said second joint part and said third joint part, the difference between the phase of said first impedance and the phase of said second impedance is 90°, and the phase of the combined impedance of said first impedance and said second impedance is 0°.

4. The high frequency coil according to claim 1, wherein said first loop part is a loop coil, and said second loop part is a loop coil.

5. The high frequency coil according to claim 1, wherein said first loop part is a figure-of-eight coil, and said second loop part is a loop coil.

6. The high frequency coil according to claim 1, wherein said first loop part and said second loop part are saddle type coils, and the saddle type coils share a common axis.

7. The high frequency coil according to claim 1, wherein said first loop part is a saddle type coil, said second loop part is a loop coil, and the center axis of said saddle type coil and the center axis of said loop coil substantially lie on the same axis.

8. The high frequency coil according to claim 1, wherein at least one of said first capacitor, said second capacitor, said third capacitor and said fourth capacitor is a trimmer capacitor.

* * * * *